US012287355B2

(12) United States Patent
Nakanishi et al.

(10) Patent No.: US 12,287,355 B2
(45) Date of Patent: Apr. 29, 2025

(54) SEMICONDUCTOR TESTING DEVICE, SEMICONDUCTOR TESTING METHOD, AND MANUFACTURING METHOD FOR SEMICONDUCTOR DEVICE

(71) Applicant: Mitsubishi Electric Corporation, Tokyo (JP)

(72) Inventors: Gaku Nakanishi, Tokyo (JP); Takahiro Mizuno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 134 days.

(21) Appl. No.: 17/912,880

(22) PCT Filed: Feb. 25, 2021

(86) PCT No.: PCT/JP2021/007166
§ 371 (c)(1),
(2) Date: Sep. 20, 2022

(87) PCT Pub. No.: WO2021/220602
PCT Pub. Date: Nov. 4, 2021

(65) Prior Publication Data
US 2023/0141552 A1    May 11, 2023

(30) Foreign Application Priority Data

May 1, 2020    (JP) ................................. 2020-080885

(51) Int. Cl.
*G01R 1/36*     (2006.01)
*G01R 31/26*    (2020.01)

(52) U.S. Cl.
CPC ........... *G01R 1/36* (2013.01); *G01R 31/2607* (2013.01)

(58) Field of Classification Search
CPC ....... G01R 1/36; G01R 31/2607; G01R 31/26
(Continued)

(56) References Cited

U.S. PATENT DOCUMENTS

2016/0025802 A1    1/2016    Sicard

FOREIGN PATENT DOCUMENTS

| JP | H0836019 A | 2/1996 |
| JP | 2005124345 A | 5/2005 |

(Continued)

OTHER PUBLICATIONS

Espacenet translation of Inspection Circuit and Inspection Method of Semiconductor Element JP2017020811 A (Year: 2017).*
(Continued)

*Primary Examiner* — Alesa Allgood
*Assistant Examiner* — Courtney G McDonnough
(74) *Attorney, Agent, or Firm* — Buchanan Ingersoll & Rooney PC

(57)    ABSTRACT

A test object includes a first semiconductor element, a first main electrode electrically connected to a positive electrode of the first semiconductor element, a second main electrode electrically connected to a negative electrode of the first semiconductor element, and a first capacitor connected between the first main electrode and the second main electrode. A semiconductor testing device comprises a DC power supply connected between a first probe and a second probe, and a controller. When the first probe is connected to the first main electrode and the second probe is connected to the second main electrode, the controller charges the first capacitor with a DC voltage supplied from a DC power supply, and inputs, to a control electrode of the first semiconductor element, a control signal for turning on the first semiconductor element, after charging the first capacitor.

17 Claims, 19 Drawing Sheets

(58) Field of Classification Search
USPC .................................................. 324/762.01
See application file for complete search history.

(56) References Cited

FOREIGN PATENT DOCUMENTS

| | | | |
|---|---|---|---|
| JP | 2006166525 A | | 6/2006 |
| JP | 2012229971 A | | 11/2012 |
| JP | 2014175643 A | | 9/2014 |
| JP | 2017020811 A | * | 1/2017 |

OTHER PUBLICATIONS

International Search Report (PCT/ISA/210), with translation, and Written Opinion (PCT/ISA/237) mailed on May 18, 2021, by the Japan Patent Office as the International Searching Authority for International Application No. PCT/JP2021/007166. (12 pages).

Notice of Reasons for Refusal dated Jul. 18, 2023, issued in the corresponding Japanese Patent Application No. 2022-518626, 12 pages including 6 pages of English Translation.

First Office Action dated Sep. 15, 2024, issued in the corresponding Chinese Patent Application No. 202180030989.9, 18 pages including 6 pages of English Translation.

* cited by examiner

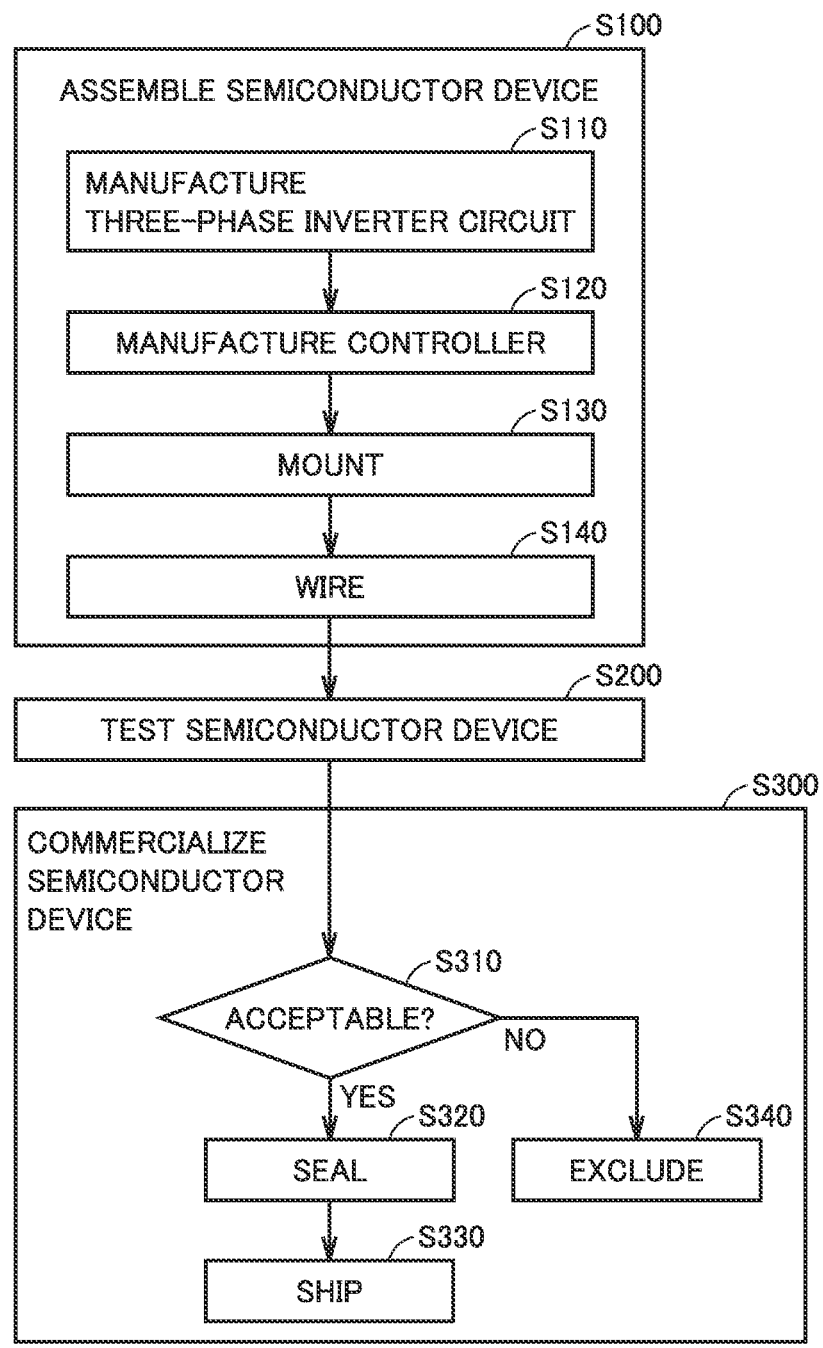

SEMICONDUCTOR TESTING DEVICE, SEMICONDUCTOR TESTING METHOD, AND MANUFACTURING METHOD FOR SEMICONDUCTOR DEVICE

TECHNICAL FIELD

The present disclosure relates to a semiconductor testing device, a semiconductor testing method, and a manufacturing method for a semiconductor device.

BACKGROUND ART

Product performance of a semiconductor element is guaranteed by performing a characteristic test (characteristic inspection and screening such as application of high voltage and/or high current to a semiconductor element, and the like) in a testing step in a manufacturing process. As a problem of such a characteristic test, there is a problem that a large breakdown current flows between the semiconductor element and a semiconductor testing device when the semiconductor element is broken, and damages the semiconductor element and the semiconductor testing device.

Japanese Patent Laying-Open No. 2014-175643 (PTL 1) discloses a method for testing a semiconductor transistor, the method including charging one end of a capacitor incorporated in a test voltage applying circuit with a test voltage, and applying the test voltage to a drain terminal of a transistor to be tested by connecting the charged one end of the capacitor to the drain terminal.

In PTL 1, by applying the test voltage to the drain terminal of the transistor to be tested via the capacitor charged in advance, when a defect occurs in the transistor to be tested during a high voltage test, an amount of charge flowing into the transistor to be tested from a testing device can be suppressed to a minimum. This configuration can prevent breakdown damage from expanding from a location of the defect, and thus facilitate identification of a factor causing the defect and the location of the defect.

CITATION LIST

Patent Literature

PTL 1: Japanese Patent Laying-Open No. 2014-175643

SUMMARY OF INVENTION

Technical Problem

However, in the testing method disclosed in PTL 1, since the testing device includes a capacitor, there is a possibility that damage to the testing device such as a test jig progresses to more than a small extent when a semiconductor element as a subject is broken during a dynamic characteristic test such as a short circuit test requiring a large charge amount. As a result, problems such as the need to repair or replace the testing device may occur.

The present disclosure has been made to solve the problems as described above, and an object of the present disclosure is to provide a semiconductor testing device, a semiconductor testing method, and a manufacturing method for a semiconductor device including a semiconductor element, capable of suppressing a progress of damage to the testing device due to a breakdown current of the semiconductor element.

Solution to Problem

In one aspect of the present disclosure, a semiconductor testing device is a semiconductor testing device to test a characteristic of a test object including a first semiconductor element. The first semiconductor element includes a positive electrode, a negative electrode, and a control electrode, and is turned on or off in response to a first control signal input to the control electrode. The test object further includes a first main electrode electrically connected to a positive electrode of the first semiconductor element, a second main electrode electrically connected to a negative electrode of the first semiconductor element, and a first capacitor electrically connected between the first main electrode and the second main electrode. The semiconductor testing device includes a first probe, a second probe, a DC power supply electrically connected between the first probe and the second probe, and a controller to generate a first control signal. When the first probe is connected to the first main electrode and the second probe is connected to the second main electrode, the controller charges the first capacitor with a DC voltage supplied from the DC power supply, and the controller inputs, to the control electrode of the first semiconductor element, the first control signal for turning on the first semiconductor element, after charging the first capacitor.

In another aspect of the present disclosure, a semiconductor testing method is a semiconductor testing method to test a characteristic of a test object including a semiconductor element. The semiconductor element includes a positive electrode, a negative electrode, and a control electrode, and is turned on or off in response to a control signal input to the control electrode. The test object further includes a first main electrode electrically connected to the positive electrode of the semiconductor element, a second main electrode electrically connected to the negative electrode of the semiconductor element, and a first capacitor electrically connected between the first main electrode and the second main electrode. The semiconductor testing method includes charging the first capacitor with a DC voltage supplied from a DC power supply electrically connected between the first main electrode and the second main electrode, and inputting, to the control electrode of the semiconductor element, the control signal for turning on the semiconductor element, after charging the first capacitor.

In another aspect of the present disclosure, a manufacturing method for a semiconductor device includes assembling the semiconductor device by mounting the semiconductor element on a housing, testing a characteristic of the semiconductor device, and commercializing the semiconductor device having been acceptable in the testing The semiconductor element includes a positive electrode, a negative electrode, and a control electrode, and is turned on or off in response to a control signal input to the control electrode. The semiconductor device further includes a first main electrode electrically connected to the positive electrode of the semiconductor element, a second main electrode electrically connected to the negative electrode of the semiconductor element, and a first capacitor electrically connected between the first main electrode and the second main electrode. The testing includes charging the first capacitor with a DC voltage supplied from a DC power supply electrically connected between the first main electrode and the second main electrode, and inputting, to the control electrode of the semiconductor element, the control signal for turning on the semiconductor element, after charging the first capacitor.

Advantageous Effects of Invention

The present disclosure can provide a semiconductor testing device, a semiconductor testing method, and a manufacturing method for a semiconductor device, capable of suppressing a progress of damage to a testing device due to a breakdown current of a semiconductor element.

BRIEF DESCRIPTION OF DRAWINGS

FIG. 19 is a flowchart illustrating a manufacturing method for a semiconductor device according to the sixth embodiment.

DESCRIPTION OF EMBODIMENTS

Figure 1:
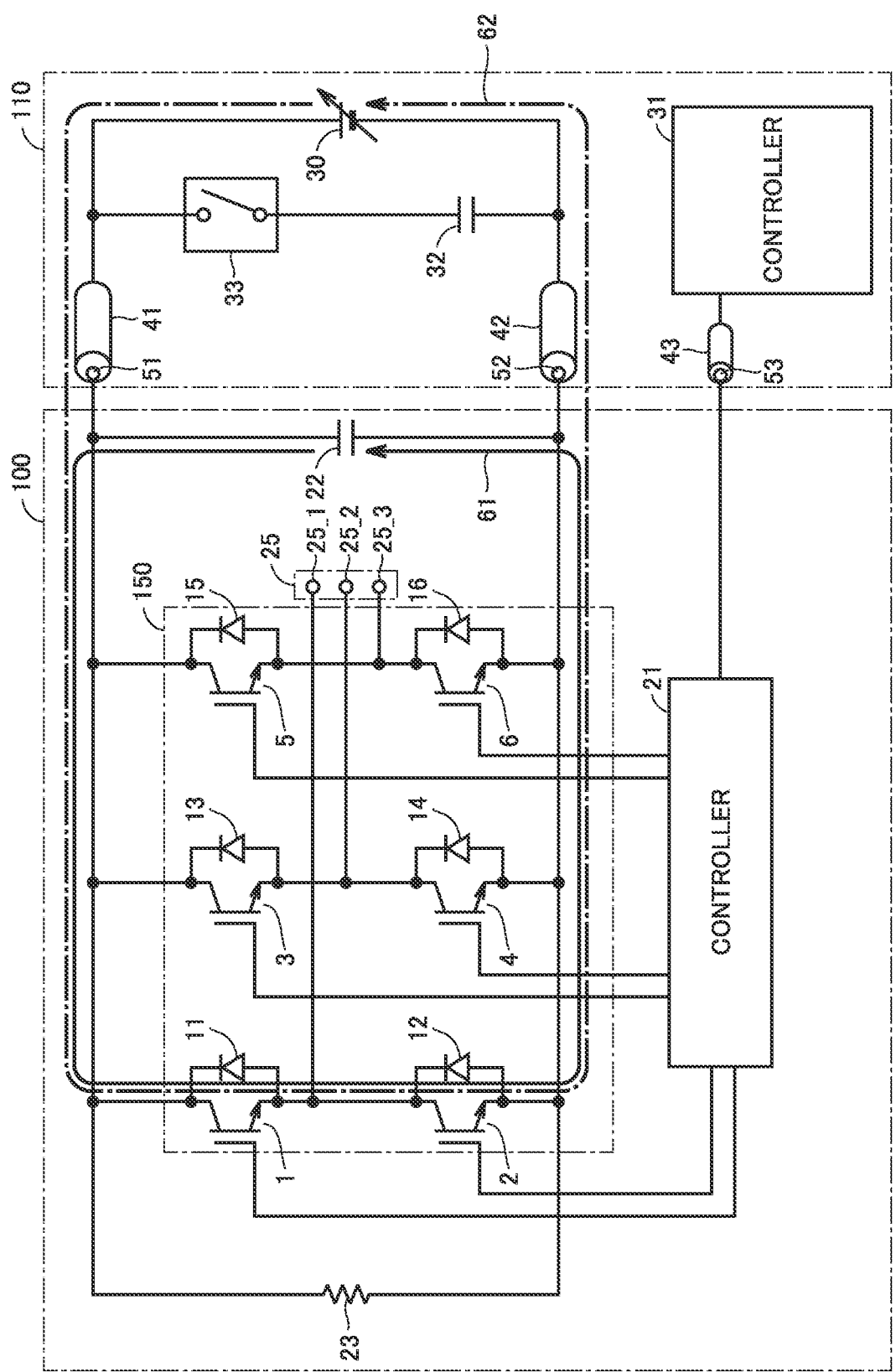
FIG. 1 is a circuit diagram illustrating a configuration of a semiconductor testing device according to a first embodiment.

Hereinafter, embodiments of the present disclosure will be described in detail with reference to the drawings. In the following description, the same or corresponding parts in the drawings are denoted by the same reference signs, and the description thereof will not be repeated in principle.

First Embodiment (Configuration of semiconductor testing device) FIG. 1 is a circuit diagram illustrating a configuration of a semiconductor testing device according to a first embodiment. A semiconductor testing device 110 according to the first embodiment is a device for performing a test of dynamic characteristic, such as a short circuit test of a test object 100 having a semiconductor switching element as a subject. In the following description, semiconductor testing device 110 is also simply referred to as a "testing device 110".

Referring to FIG. 1, testing device 110 includes a DC power supply 30, a controller 31, a capacitor 32, a switch 33, and probes 41, 42, and 43. DC power supply 30 is configured to apply a DC voltage between main electrodes 51 and 52 of test object 100. DC power supply 30 is, for example, a storage battery. A power supply voltage of DC power supply 30 is, for example, about 650 V.

Controller 31 is electrically connected to a controller 21 included in test object 100 and is configured to control controller 21 to test the subject.

Capacitor 32 and switch 33 are electrically connected in series between a positive electrode and a negative electrode of DC power supply 30. As capacitor 32, for example, an electrolytic capacitor, a film capacitor, a ceramic capacitor, or the like can be used. Capacitor 32 is useful when a current exceeding a supply capability of DC power supply 30 is supplied to test object 100 in a short time. Capacitor 32 enables smoothing of the DC voltage of DC power supply 30. Capacitor 32 corresponds to one example of a "second capacitor".

Switch 33 constitutes a cutoff circuit for cutting off charging of capacitor 32 by DC power supply 30. A semiconductor switch or a mechanical switch can be applied to switch 33. The semiconductor switch is typically a semiconductor switching element such as an IGBT or a MOSFET. The mechanical switch is, for example, a switch such as a relay. Switch 33 corresponds to one example of a "first switch".

Switch 33 is made conductive (on) or non-conductive (off) in response to a control signal given from controller 31. By turning on switch 33, DC power is supplied from DC power supply 30 to capacitor 32, and capacitor 32 is charged. By turning off switch 33, charging of capacitor 32 is cut off.

In probe 41, a first terminal is electrically connected to the positive electrode of DC power supply 30, and a second terminal is electrically connected to a high-voltage main electrode 51 of test object 100. In probe 42, a first terminal is electrically connected to the negative electrode of DC power supply 30, and a second terminal is electrically connected to a low-voltage main electrode 52 of test object 100. In probe 43, a first terminal is electrically connected to controller 31, and a second terminal is electrically connected to a control terminal 53 of test object 100. Control terminal 53 is electrically connected to controller 21. Probe 41 corresponds to one example of a "first probe", and probe 42 corresponds to one example of a "second probe". High-voltage main electrode 51 corresponds to one example of a "first main electrode", and low-voltage main electrode 52 corresponds to one example of a "second main electrode".

(First Configuration Example of Test Object 100)

Test object 100 according to a first configuration example includes, as a main circuit, a full-bridge three-phase inverter circuit 150 that converts DC power input between high-voltage main electrode 51 and low-voltage main electrode 52 into three-phase AC power, a three-phase output electrode 25 (a U-phase output electrode 25_1, a V-phase output electrode 25_2, and a W-phase output electrode 25_3), controller 21 for controlling three-phase inverter circuit 150, capacitor 22, and discharge resistance 23.

Three-phase inverter circuit 150 includes semiconductor switching elements 1 to 6 and diodes 11 to 16. Each of semiconductor switching elements 1 to 6 has a positive electrode, a negative electrode, and a control electrode. Each of semiconductor switching elements 1 to 6 is controllable of formation (on) and cutoff (off) of a current path between the positive electrode and the negative electrode in response to a control signal (voltage or current) input from controller 21 to the control electrode.

As semiconductor switching elements 1 to 6, any self-arc-extinguishing semiconductor element can be applied. For example, when the semiconductor switching element is a metal-oxide semiconductor field-effect transistor (MOSFET), the positive electrode refers to a drain electrode, the negative electrode refers to a source electrode, and the control electrode refers to a gate electrode. When the semiconductor switching element is an insulated gate bipolar transistor (IGBT), the positive electrode refers to an emitter electrode, the negative electrode refers to a collector electrode, and the control electrode refers to a gate electrode. In the configuration example in FIG. 1, the semiconductor switching element is an IGBT. In the following description, semiconductor switching elements 1 to 6 are also referred to as IGBTs 1 to 6.

In three-phase inverter circuit 150, the emitter electrodes of IGBTs 1, 3, and 5 are connected to high-voltage main electrode 51, and the collector electrodes of IGBTs 2, 4, and 6 are connected to low-voltage main electrode 52. The collector electrode of IGBT 1 and the emitter electrode of IGBT 2 are connected by U-phase output electrode 25_1. The collector electrode of IGBT 3 and the emitter electrode of IGBT 4 are connected by V-phase output electrode 25_2. The collector electrode of IGBT 5 and the emitter electrode of IGBT 6 are connected by W-phase output electrode 25_3. Three-phase output electrode 25 is connected to a load such as a motor, for example, and is used to drive the load.

Diodes 11 to 16 are connected in anti-parallel to IGBTs 1 to 6 to form freewheeling diodes. When a MOSFETs is used for the semiconductor switching element, a built-in body diode can be used as a freewheeling diode. As a material constituting the semiconductor switching element, silicon carbide (SiC) or gallium nitride (GaN), which is a wide bandgap semiconductor, can be applied in addition to silicon (Si).

Although not shown, a sense terminal is connected to each emitter electrode of IGBTs 1 to 6. The sense terminal is electrically connected to controller 21. A current (hereinafter, also referred to as a sense current) obtained by dividing a main current (emitter current) flowing between the collector electrode and the emitter electrode of the corresponding IGBT at a constant ratio (for example, 1/10,000) flows through the sense terminal.

Controller 21 is configured to control the current flowing through main electrodes 51 and 52 or three-phase output electrode 25_1 to 25_3 of test object 100 on the basis of the sense current of each of IGBTs 1 to 6. For example, when the sense current of IGBT 1 is greater than or equal to a threshold value (for example, 1 A or more), controller 21 determines that the main current (emitter current) of IGBT 1 is an overcurrent, and generates a control signal for turning off IGBT 1. Controller 21 inputs the generated control signal to the gate electrode of IGBT 1.

Each of IGBTs 1 to 6 is turned on when a control signal input to the gate electrode transitions from an L (logic low) level to an H (logic high) level, and is turned off when the control signal transitions from the H level to the L level. Each of IGBTs 1 to 6 may be turned on when the control signal transitions from the H level to the L level, and may be turned off when the control signal transitions from the L level to the H level.

A function generator (arbitrary waveform generator) can be used as controller 21. Alternatively, the functions of controller 21 can be implemented by software processing and/or hardware processing by a microcomputer.

During a test of test object 100 using testing device 110, controller 31 generates a control signal for turning on and off IGBTs 1 to 6. Controller 21 receives a control signal from controller 31 via probe 43 and control terminal 53. Controller 21 inputs the received control signal to the gate electrode of each of IGBTs 1 to 6.

Capacitor 22 is electrically connected between high-voltage main electrode 51 and low-voltage main electrode 52. Capacitor 22 is a DC voltage smoothing capacitor. As capacitor 22, for example, an electrolytic capacitor, a film capacitor, a ceramic capacitor, or the like can be used. Capacitor 22 corresponds to one example of a "first capacitor".

Discharge resistance 23 is a resistance for discharging a stray capacitance of capacitor 22, wires of test object 100 (not illustrated), and IGBTs 1 to 6. For example, when test object 100 and an external control circuit that controls test object 100 are electrically cut off due to occurrence of disconnection or the like during actual operation, discharge resistance 23 is used to discharge a charge charged in test object 100. In this case, it is desirable that the discharge is completed within several seconds after the disconnection occurs. For example, when a sum of the stray capacitance of capacitor 22, the wires of test object 100, and IGBTs 1 to 6 is 100 μF, a resistance value of discharge resistance 23 is desirably about 20 kΩ.

(Operation of Semiconductor Testing Device)

Next, the operation of semiconductor testing device 110 according to the first embodiment will be described.

First, as a comparative example of a semiconductor testing method according to the first embodiment, a general semiconductor testing method using testing device 110 will be described.

In a general semiconductor testing method, capacitor 32 is charged in advance using DC power supply 30 by turning on switch 33 in testing device 110. Thus, power is supplied to test object 100 by charged capacitor 32. In order to reduce costs, a high-voltage power supply having a maximum output current of 1 A or less is often used as DC power supply 30.

In a case where the subject fails when energy is applied from capacitor 32 to the subject in test object 100, it is possible to suppress a progress of damage to the subject and probes 41 and 42 by detecting the failure of the subject and quickly turning off switch 33.

However, when a mechanical switch is used as switch 33, it often takes several tens of mm seconds to turn off switch 33. For example, when the voltage applied between main electrodes 51 and 52 is 650 V, the electrostatic capacitance of capacitor 32 is 10,000 μF, and a resistance component included in a current path formed between capacitor 32 and the subject is 0.2Ω, a current of 3,250 A at maximum continues to flow in the current path for 20 ms. Therefore, when switch 33 is turned off, all the charges stored in capacitor 32 are discharged, which may progress the damage to the subject and probes 41 and 42.

On the other hand, when a semiconductor switch is used for switch 33, for example, when an IGBT is used for switch 33, it often takes several μs to turn off switch 33. Thus, switch 33 can be turned off to cut off the current path before the charge of capacitor 32 is completely discharged. However, in general, when a current of several thousands of A continues to flow over several μs, a probe having a rated current of several tens of A may be damaged too much to be continuously used.

As described above, in the configuration in which the energy stored in advance in capacitor 32 of testing device 110 is supplied to the subject, there is a concern that the damage to the subject and probes 41 and 42 progresses due to the time required for turning off switch 33 connected in series to capacitor 32.

Next, the semiconductor testing method according to the first embodiment will be described with reference to FIGS. 2 and 3. In the following description, an element to be a subject is IGBT 1, and a short circuit test of IGBT 1 is performed as a dynamic characteristic test. During the short circuit test, IGBTs 3 to 6 other than IGBT 1 and IGBT 2 connected in series to IGBT 1 are always in an off state.

Figure 2:
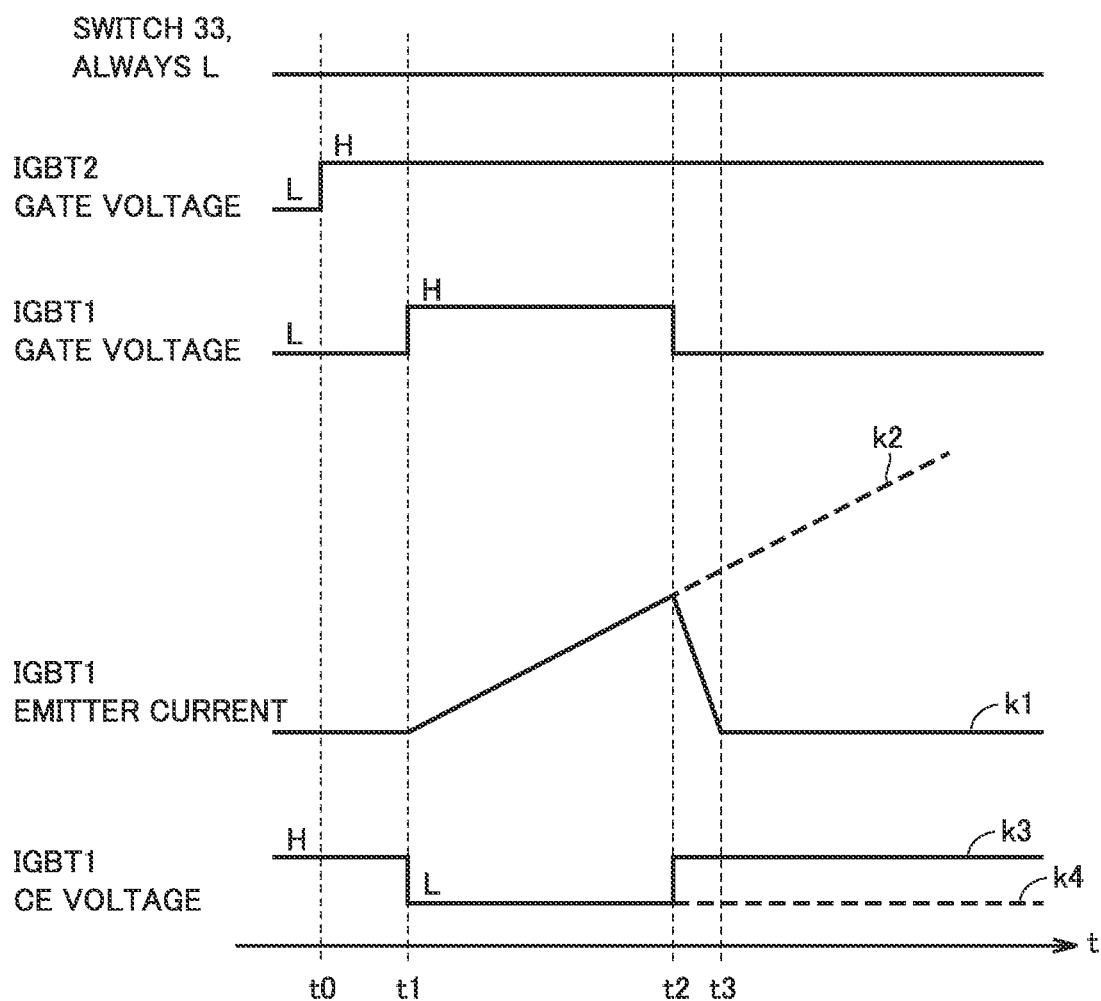
FIG. 2 is a timing chart for describing operation of a testing device and a test object in a short circuit test according to the first embodiment.

FIG. 2 is a timing chart for describing the operation of testing device 110 and test object 100 in the short circuit test according to the first embodiment. FIG. 2 illustrates waveforms of switch 33, a gate voltage of IGBT 2, a gate voltage of IGBT 1, an emitter current of IGBT 1, and a collector-emitter (CE) voltage of IGBT 1 in order from the top. In the example in FIG. 2, similarly to the IGBTs, it is assumed that switch 33 is also turned off upon receipt of an L-level control signal and is turned on upon receipt of an H-level control signal.

Referring to FIG. 2, at time t0, controller 31 inputs an H-level control signal to the gate electrode of IGBT 2 through controller 21 while switch 33 is held in the off state. As a result, IGBT 2 is turned on. At this time, since the L-level control signal is input to the gate electrode of IGBT 1, IGBT 1 is not turned on. Thus, no current flows between high-voltage main electrode 51 and low-voltage main electrode 52. In testing device 110, since switch 33 is turned off, capacitor 32 is not charged. Therefore, after time t0, only capacitor 22 of test object 100 is charged.

Next, at time t1, controller 31 inputs an H-level control signal to the gate electrode of IGBT 1 through controller 21 to turn on IGBT 1. When IGBT 1 is turned on, main electrodes 51 and 52 are short-circuited. As a result, a short-circuit current starts to flow between main electrodes 51 and 52 due to the charge stored in capacitor 22. The short-circuit current flows from the positive electrode of capacitor 22 to the negative electrode of capacitor 22 via IGBTs 1 and 2 through a current path 61 indicated by a solid line in FIG. 1. The short-circuit current flows from the positive electrode of DC power supply 30 to the negative electrode of DC power supply 30 via probe 41, high-voltage main electrode 51, IGBT 1, IGBT 2, low-voltage main electrode 52, and probe 42 through a current path 62 indicated by a broken line in FIG. 1. The waveform of the emitter current of IGBT 1 in FIG. 2 represents a temporal change in the short-circuit current.

Here, when the short-circuit current flowing through current path 61 is compared with the short-circuit current flowing through current path 62, the short-circuit current flowing through current path 61 is significantly larger. Thus, the short-circuit current flowing through current path 62 can be ignored. This is because the maximum output current of DC power supply 30 is often 1 A or less in a general testing device, and thus most of the short-circuit current reaching several thousands of A at time t2 is supplied from capacitor 22. This is also because capacitor 22 is built in same test object 100 as IGBT 1, whereas DC power supply 30 is often installed several meters away from test object 100. In this case, since current path 62 includes a larger floating inductance than current path 61, an increase in the current is hindered by the floating inductance. As a result, only a current smaller than the maximum output current of DC power supply 30 may flow through current path 62.

As illustrated in FIG. 2, the emitter current (that is, short-circuit current) of IGBT 1 increases after time t1. Controller 21 monitors the emitter current of IGBT 1 on the basis of the sense currents of IGBTs 1 and 2. In a case where a sense current equal to or larger than the threshold value is detected at time t2, controller 21 causes the control signal input to the gate electrode of IGBT 1 to transition from the H level to the L level. As a result, IGBT 1 is turned off.

When IGBT 1 is turned off at time t2, a short circuit mode between main electrodes 51 and 52 is cancelled, and thus the emitter current of IGBT 1 sharply decreases after time t2 as indicated by a waveform k1. At the same time as the emitter current decreases, the collector-emitter voltage of IGBT 1 increases to the H level as indicated by a waveform k3. At this time, since the charge stored in capacitor 22 is discharged through discharge resistance 23, the emitter current of IGBT 1 decreases in accordance with a time constant CR determined by an electrostatic capacitance C of capacitor 22 and a resistance value R of discharge resistance 23. For example, when electrostatic capacitance C=1,000 μF and resistance value R=200 kΩ, about 63% of the charge is discharged in two seconds.

On the other hand, when IGBT 1 is broken during the short circuit mode, IGBT 1 is not turned off at time t2, and thus the emitter current continues to increase after time t2 as indicated by waveform k2. The collector-emitter voltage of IGBT 1 is held at the L level as indicated by a waveform k4. For example, when the voltage applied between main electrodes 51 and 52 is 650 V, the electrostatic capacitance of capacitor 22 is 1,000 μF, and a resistance component included in current path 61 is 0.2Ω, a short-circuit current of 3,250 A at maximum continues to flow for 2 ms.

Here, a case where a short-circuit current is supplied from capacitor 32 built in testing device 110 to IGBT 1 as in the comparative example will be considered. Although the electrostatic capacitance of capacitor 22 is set to an optimum capacitance in accordance with a specification of test object 100, an electrostatic capacitance of capacitor 32 may be set to ten times or more the electrostatic capacitance of capacitor 22 in some cases because testing device 110 needs to test various semiconductor elements.

For example, when the electrostatic capacitance of capacitor 32 is ten times the electrostatic capacitance of capacitor 22, assuming that the voltage applied between main electrodes 51 and 52 is 650 V, the electrostatic capacitance of capacitor 32 is 10,000 μF, and a resistance component included in current path 62 is 0.2Ω, a current of 3,250 A at maximum continues to flow in probes 41 and 42 for 20 ms after time t1.

Normally, since a contact area between the probe and the main electrode is smaller than an entire area of the main electrode, the rated current of the probe is often several tens of A. Therefore, as described above, as the current of 3,250 A at maximum continues to flow, there is a risk that probes 41 and 42 are burned or probe 41 and high-voltage main electrode 51 and/or probe 42 and low-voltage main electrode 52 are fused. As a result, every time the IGBT of the subject is broken, the operation of testing device 110 is stopped, and work such as replacement of probes 41 and 42 and/or failure confirmation of testing device 110 occurs.

On the other hand, in the semiconductor testing method according to the first embodiment, when IGBT 1 as a subject is broken, a short-circuit current flows through current path 61 formed between capacitor 22 and IGBTs 1 and 2 in test object 100, and thus a large current can be prevented from flowing through testing device 110. It is therefore possible to suppress the progress of damage to a test jig such as probes 41 and 42 in contact with the broken semiconductor element, damage to test object 100 caused by the damage to the test jig, a conveyance failure or the like of a test object to be tested next to test object 100.

Figure 3:
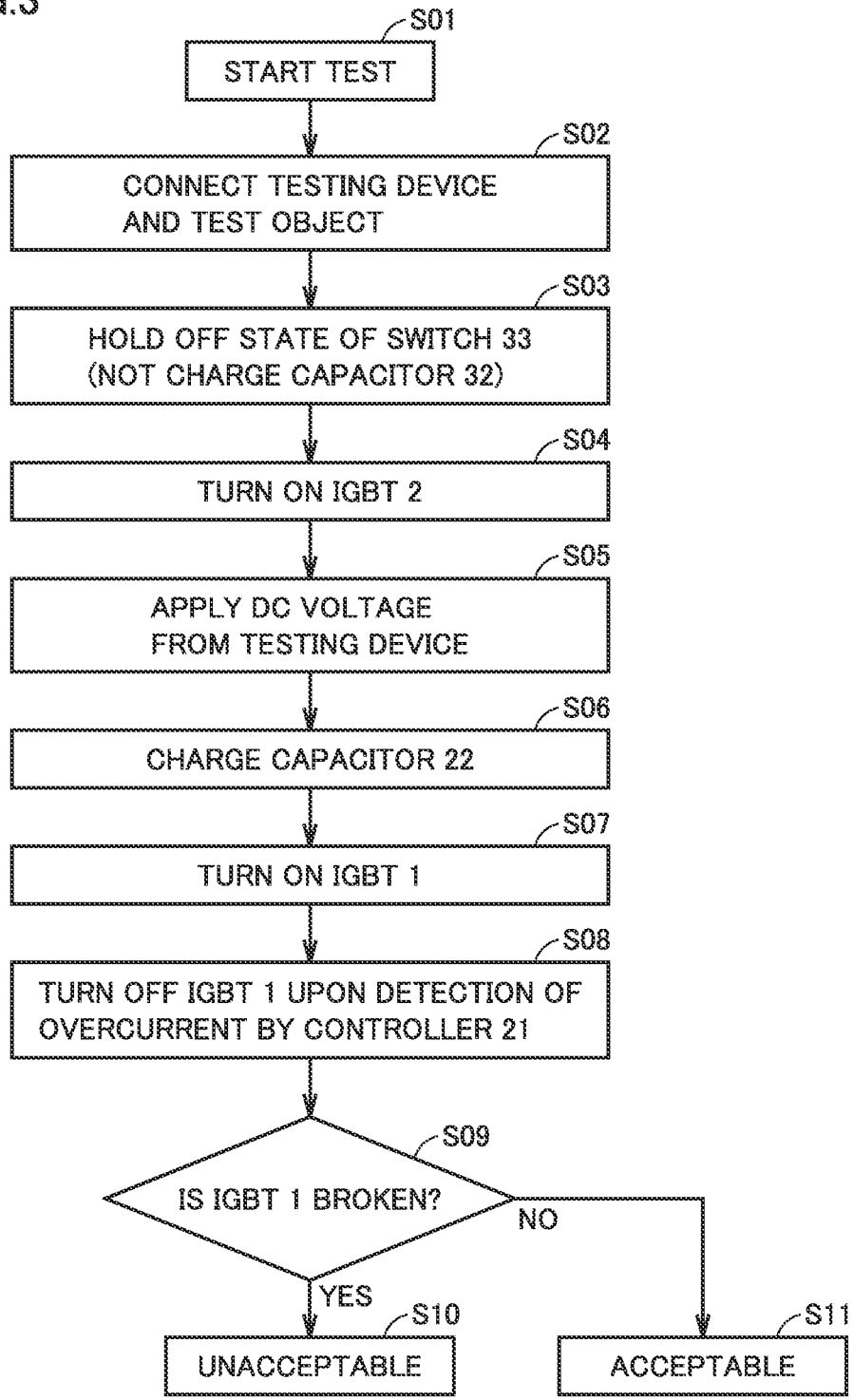
FIG. 3 is a flowchart for describing a processing procedure of a semiconductor testing method according to the first embodiment.

FIG. 3 is a flowchart for describing a processing procedure of the semiconductor testing method according to the first embodiment. FIG. 3 illustrates a processing procedure of the short circuit test when IGBT 1 is used as a subject.

Referring to FIG. 3, when the short circuit test by testing device 110 is started in step S01, probes 41 and 42 of testing device 110 are connected to main electrodes 51 and 52 of test object 100, respectively, in step S02, and thus test object 100 and testing device 110 are electrically connected. Controller 21 and controller 31 are communicably connected by connecting probe 43 of testing device 110 to control terminal 53 of test object 100. In this state, in step S03, controller 31 does not charge capacitor 32 by holding switch 33 in the off state.

Next, in step S04, controller 21 receives a command from controller 31 and inputs an H-level control signal to the gate electrode of IGBT 2 to turn on IGBT 2. Subsequently, in step S05, controller 31 applies a DC voltage from DC power supply 30 of testing device 110 to main electrodes 51 and 52 via probes 41 and 42. By applying the DC voltage, capacitor 22 in test object 100 is charged in step S06.

When capacitor 22 is charged, in step S07, controller 21 inputs an H-level control signal to the gate electrode of IGBT 1 to turn on IGBT 1. As a result, both IGBTs 1 and 2 are turned on, and main electrodes 51 and 52 are short-circuited.

Controller 21 monitors the emitter current of IGBT 1 on the basis of the sense currents of IGBTs 1 and 2. When the sense current becomes greater than or equal to the threshold value, controller 21 detects an overcurrent of the emitter current of IGBT 1. In this case, in step S08, controller 21 causes the control signal input to the gate electrode of IGBT 1 to transition from the H level to the L level to turn off IGBT 1.

When the sense current continues to increase due to IGBT 1 being not turned off upon receipt of the L-level control signal, controller 21 determines that IGBT 1 has been broken (YES in S09), and determines that the dynamic characteristic of IGBT 1 is unacceptable in step S10. On the other hand, when the sense current decreases due to IGBT 1 being normally turned off, controller 21 determines that IGBT 1 is not broken (NO in S09), and determines that the dynamic characteristic of IGBT 1 is acceptable in step S11.

When the short circuit test is performed using IGBT 2 as the subject, IGBT 1 is to be replaced with IGBT 2 and IGBT 2 is to be replaced with IGBT 1 in the above description. When the short circuit test is performed on the IGBT of another phase of three-phase inverter circuit 150, IGBT 1 is to be replaced with the IGBT of the other phase, and the IGBT 2 is to be replaced with an IGBT connected in series to the IGBT of the other phase. In this way, the short circuit test can be performed on all IGBTs 1 to 6 constituting three-phase inverter circuit 150.

As described above, in the semiconductor testing device and the semiconductor testing method according to the first embodiment, capacitor 22 connected between main electrodes 51 and 52 in test object 100 is charged in advance, and a characteristic test of the subject is performed using the energy stored in capacitor 22. It is therefore possible to prevent a large current from flowing through the testing device when the subject is broken during the test. As a result, it is possible to suppress the progress of damage to the testing device due to a breakdown current of the semiconductor element.

Second Embodiment (Configuration of Semiconductor Testing Device)

Figure 4:
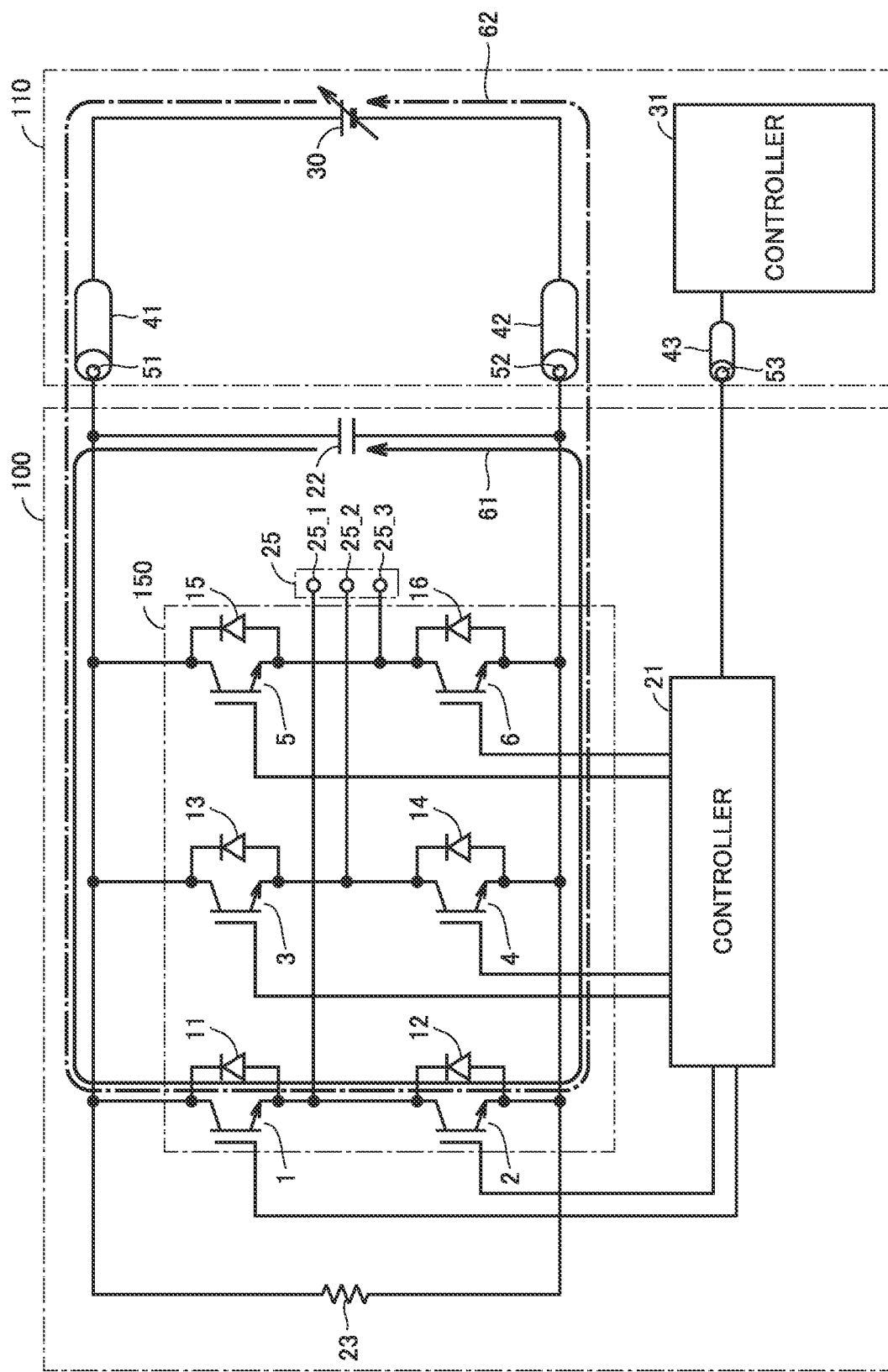
FIG. 4 is a circuit diagram illustrating a configuration of a semiconductor testing device according to a second embodiment.

FIG. 4 is a circuit diagram illustrating a configuration of a semiconductor testing device according to a second embodiment. Referring to FIG. 4, semiconductor testing device 110 according to the second embodiment is different from semiconductor testing device 110 according to the first embodiment illustrated in FIG. 1 in that a series circuit of capacitor 32 and switch 33 is not provided.

In the semiconductor testing method according to the first embodiment described above, switch 33 is turned off before a DC voltage is applied from DC power supply 30 to main electrodes 51 and 52 of test object 100, and capacitor 32 is not charged. On the other hand, in the semiconductor testing method according to the second embodiment, testing device 110, which does not include the series circuit of capacitor 32 and switch 33, eliminates the need for processing of turning off switch 33.

(Operation of Semiconductor Testing Device)

Next, the operation of semiconductor testing device 110 according to the second embodiment will be described with reference to FIGS. 5 and 6. In the second embodiment, as in the first embodiment, the semiconductor element to be a subject is IGBT 1, and a short circuit test of IGBT 1 is performed. The operation of semiconductor testing device 110 according to the second embodiment will be described only in terms of differences from the operation of semiconductor testing device 110 according to the first embodiment described with reference to FIGS. 2 and 3.

Figure 5:
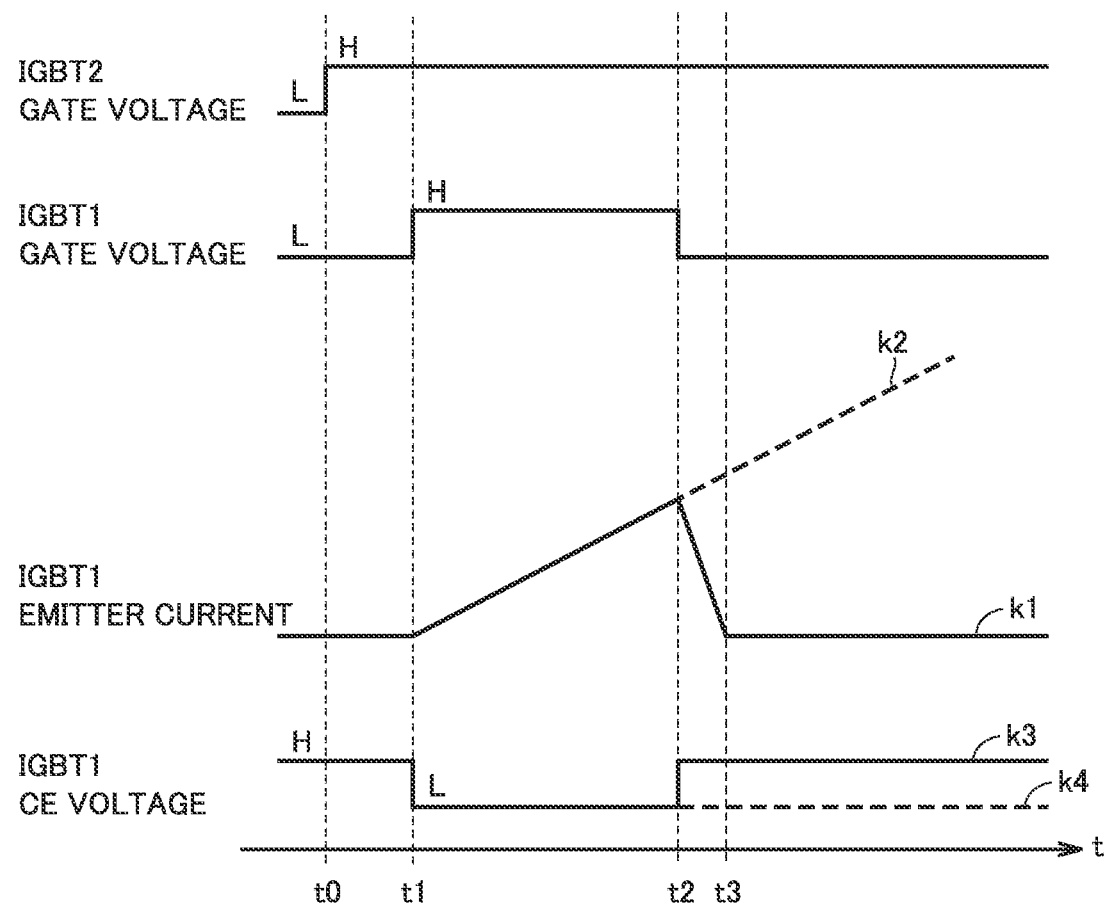
FIG. 5 is a timing chart for describing operation of a testing device and a test object in a short circuit test according to the second embodiment.

FIG. 5 is a timing chart for describing the operation of testing device 110 and test object 100 in the short circuit test according to the second embodiment. FIG. 5 illustrates waveforms of a gate voltage of IGBT 2, a gate voltage of IGBT 1, an emitter current of IGBT 1, and a collector-emitter voltage of IGBT 1 in order from the top. That is, the timing chart in FIG. 5 is equal to the timing chart in FIG. 2 from which the waveform of switch 33 is removed.

Figure 6:
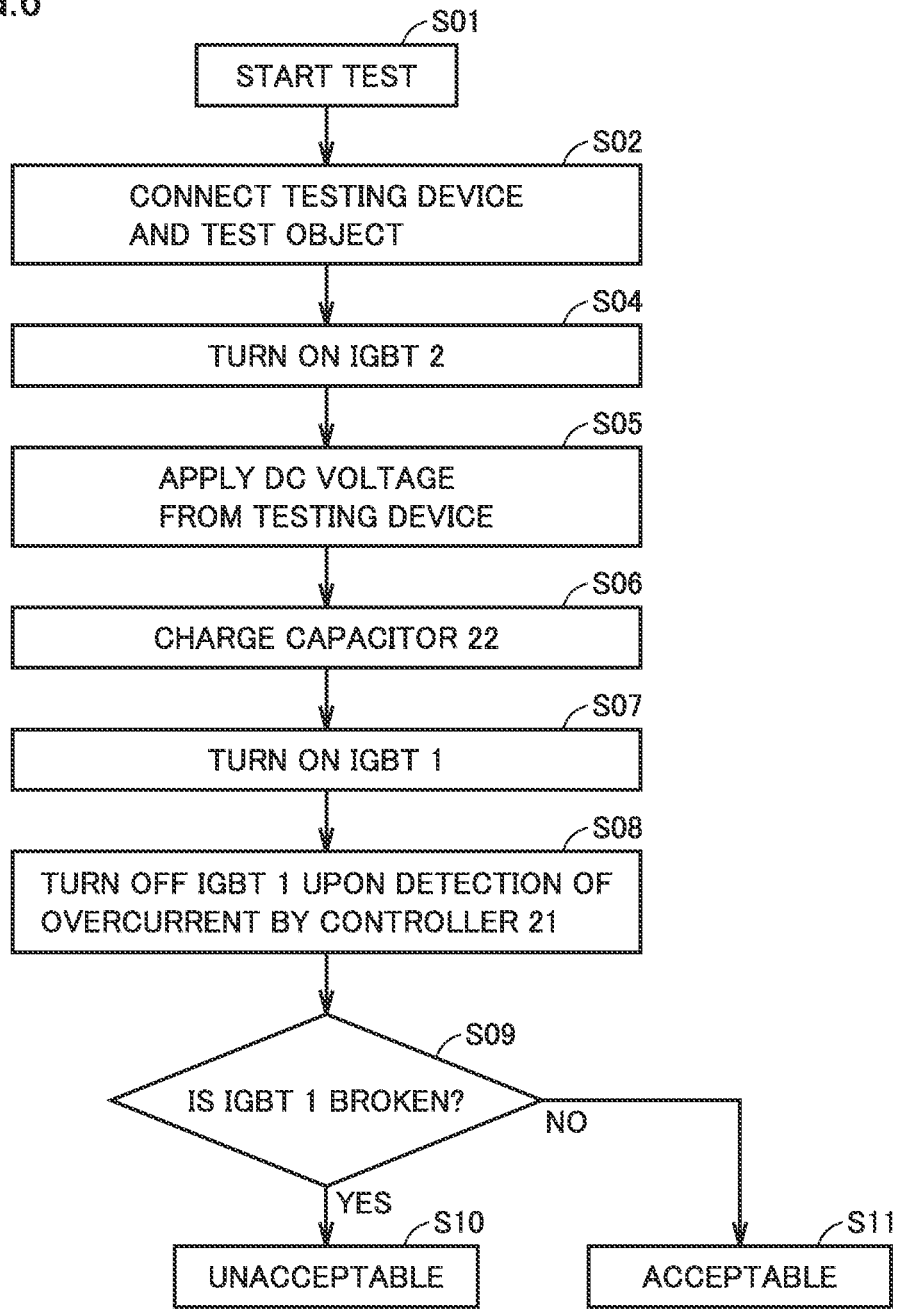
FIG. 6 is a flowchart for describing a processing procedure of a testing method according to the second embodiment.

FIG. 6 is a flowchart for describing a processing procedure of a testing method according to the second embodiment. The flowchart in FIG. 6 is equivalent to the flowchart illustrated in FIG. 3 from which the processing of step S03 (processing of holding switch 33 in the off state) is removed.

In the second embodiment, similarly, when IGBT 1 is turned on after capacitor 22 in test object 100 is charged (time t1), main electrodes 51 and 52 are short-circuited, and a short-circuit current starts to flow due to the charge stored in capacitor 22. Since most of the short-circuit current at this time flows through current path 61 illustrated in FIG. 4, it is possible to prevent a large current from flowing through testing device 110. Therefore, functions and effects similar to those of the semiconductor testing device and testing method according to the first embodiment can be obtained.

Third Embodiment (Second Configuration Example of Test Object)

Figure 7:
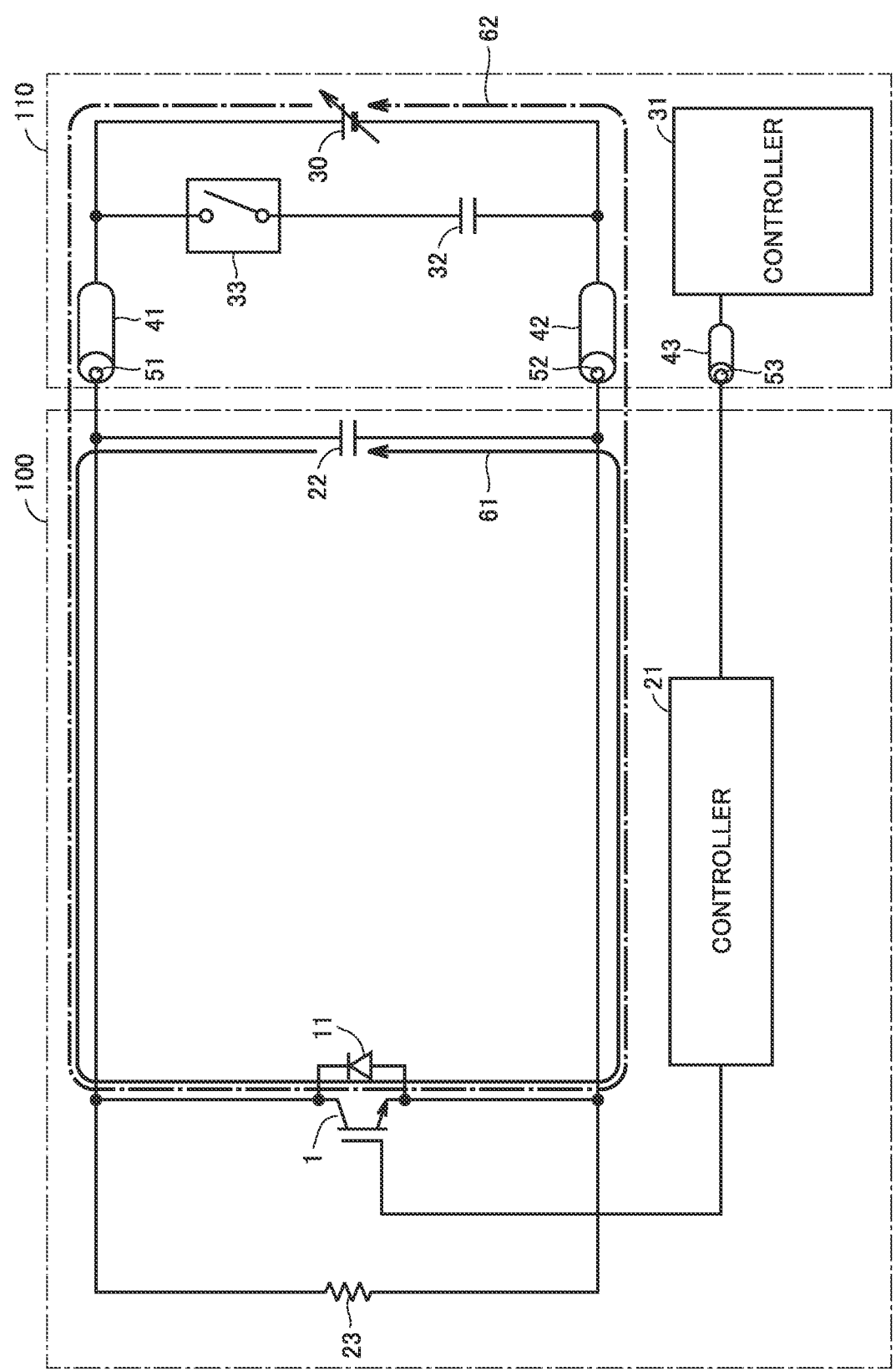
FIG. 7 is a circuit diagram illustrating a configuration of a semiconductor testing device according to a third embodiment.

FIG. 7 is a circuit diagram illustrating a configuration of a semiconductor testing device according to a third embodiment. Referring to FIG. 7, semiconductor testing device 110 according to the third embodiment is different from semiconductor testing device 110 according to the first embodiment illustrated in FIG. 1 in the configuration of test object 100.

Test object 100 according to a second configuration example illustrated in FIG. 7 includes IGBT 1, diode 11, and capacitor 22. The emitter electrode of IGBT 1 is connected to high-voltage main electrode 51, and the collector electrodes of IGBT 1 is connected to low-voltage main electrode 52. Diode 11 is connected in anti-parallel to IGBT 1. The sense terminal (not shown) of IGBT 1 is electrically connected to controller 21. Capacitor 22 is electrically connected in parallel to IGBT 1 between high-voltage main electrode 51 and low-voltage main electrode 52.

(Operation of Semiconductor Testing Device)

In semiconductor testing device 110 according to the third embodiment, the short circuit test of IGBT 1 as a subject can be also performed in accordance with the flowchart illustrated in FIG. 3. However, since IGBT 2 does not exist in test object 100, the processing of step S04 can be omitted. That is, testing device 110 is connected between main electrodes 51 and 52 of test object 100 (S01 in FIG. 3), and a DC voltage is applied between main electrodes 51 and 52 (S05 in FIG. 3) while switch 33 is held in the off state (S03 in FIG. 3). When capacitor 22 is charged upon receipt of the DC voltage (S06 in FIG. 3), controller 21 turns on IGBT 1 (S07 in FIG. 3), and detects the short-circuit current on the basis of the sense current of IGBT 1. When the sense current of IGBT 1 becomes greater than or equal to the threshold value, controller 21 turns off the IGBT 1 (S08 in FIG. 3), and determines whether IGBT 1 is broken on the basis of the sense current after turning off IGBT 1 (S09 in FIG. 3).

In the third embodiment, as in the first embodiment, when IGBT 1 is turned on, most of the short-circuit current flows through current path 61 illustrated in FIG. 7, and thus a large current can be prevented from flowing through testing device 110. Therefore, functions and effects similar to those of the semiconductor testing device and testing method according to the first embodiment can be obtained.

Fourth Embodiment (Third Configuration Example of Test Object)

Figure 8:
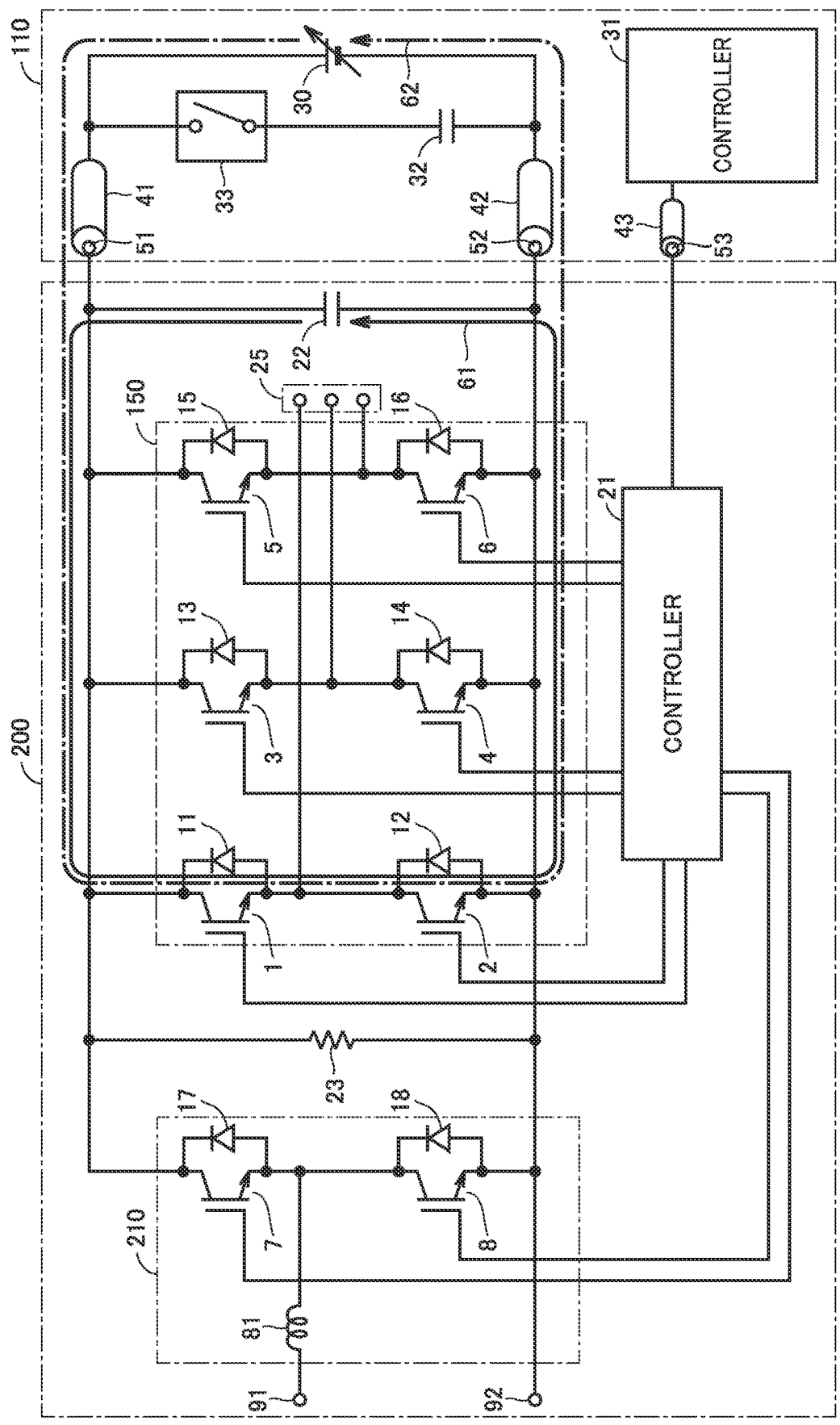
FIG. 8 is a circuit diagram illustrating a configuration of a semiconductor testing device according to a fourth embodiment.

FIG. 8 is a circuit diagram illustrating a configuration of a semiconductor testing device according to a fourth embodiment. Referring to FIG. 8, semiconductor testing device 110 according to the fourth embodiment is different from semiconductor testing device 110 according to the first embodiment illustrated in FIG. 1 in the configuration of the test object.

A test object 200 according to a third configuration example is obtained by adding a step-up converter circuit 210 to a DC side of three-phase inverter circuit 150 in test object 100 according to the first configuration example illustrated in FIG. 1. Step-up converter circuit 210 includes semiconductor switching elements 7 and 8, diodes 17 and 18, a reactor 81, and input electrodes 91 and 92. Similarly to semiconductor switching element 1 to 6, each of semiconductor switching elements 7 and 8 has a positive electrode, a negative electrode, and a control electrode, and is controllable of turning on and off in response to a control signal applied from controller 21 to the control electrode. In a configuration example in FIG. 8, semiconductor switching elements 7 and 8 are IGBTs. In the following description, semiconductor switching elements 7 and 8 are also referred to as IGBTs 7 and 8. Input electrodes 91 and 92 correspond to one example of a "first input electrode" and a "second input electrode".

In step-up converter circuit 210, the emitter electrode of IGBT 7 is connected to high-voltage main electrode 51, and the emitter electrode of IGBT 8 is connected to low-voltage main electrode 52 and low-voltage input electrode 92. The emitter electrode of IGBT 7 and the collector electrode of IGBT 8 are connected to a first terminal of reactor 81. A second terminal of reactor 81 is connected to high-voltage input electrode 91.

Test object 200 is configured such that a DC voltage applied between input electrodes 91 and 92 is stepped up to a voltage capable of driving a load (for example, a motor) connected to three-phase output electrode 25 by step-up converter circuit 210, and the stepped-up voltage is converted into a three-phase AC voltage by three-phase inverter circuit 150 and supplied to the load. Specifically, controller 21 calculates a duty ratio for setting an output voltage of step-up converter circuit 210 to a target voltage, and generates a control signal for controlling turning on and off of IGBTs 7 and 8 of step-up converter circuit 210 on the basis of the calculated duty ratio. Controller 21 further generates a control signal for controlling turning on and off of IGBT 1 to 6 of three-phase inverter circuit 150. Controller 21 inputs the generated control signal to the control electrodes of IGBTs 1 to 8.

In test object 200 according to the third configuration example, testing device 110 can also perform a short circuit test of IGBT 1 to 6 constituting three-phase inverter circuit 150 using the semiconductor testing method according to the first embodiment.

Fifth Embodiment

Figure 9:
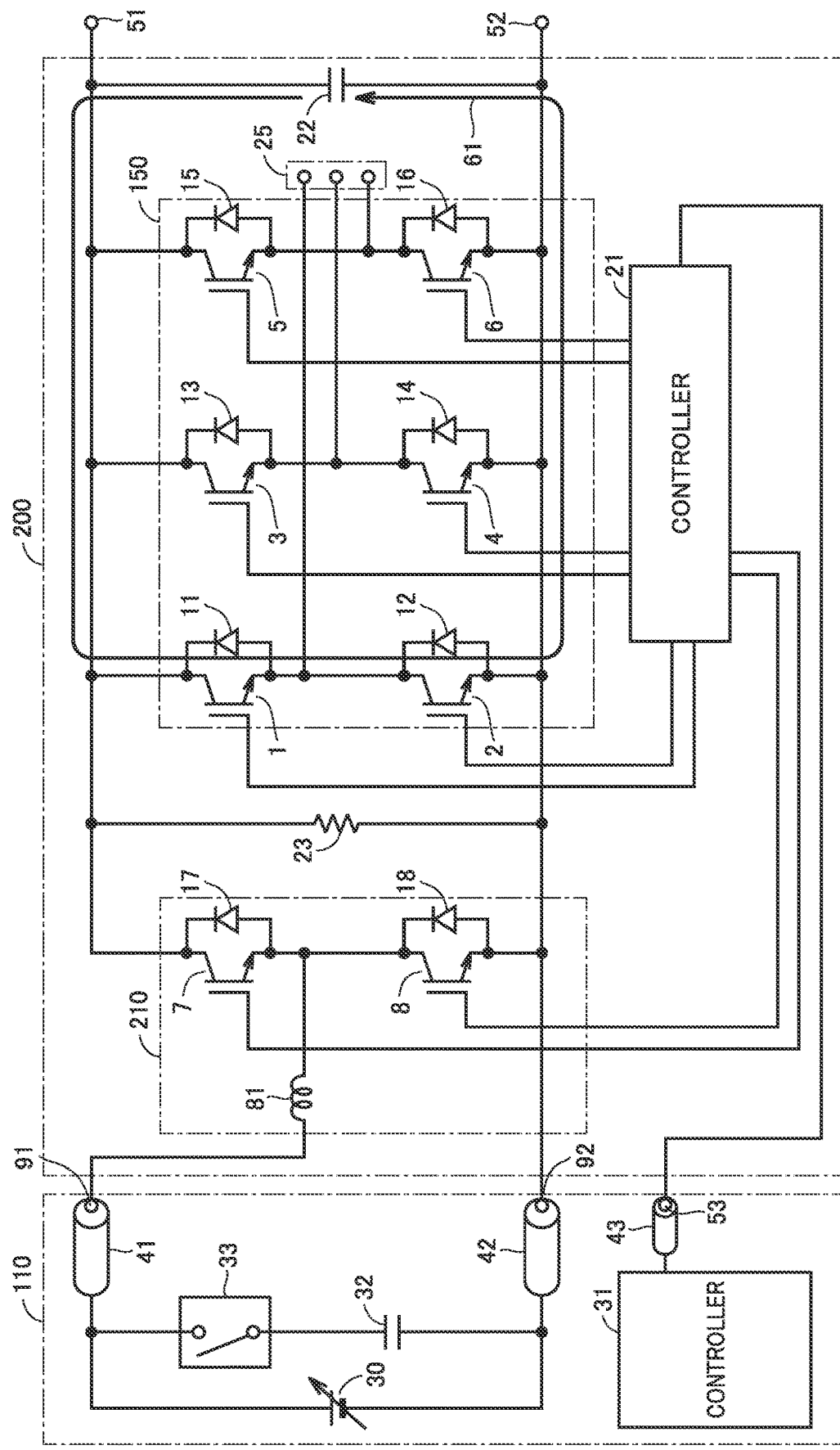
FIG. 9 is a circuit diagram illustrating a configuration of a semiconductor testing device according to a fifth embodiment.

FIG. 9 is a circuit diagram illustrating a configuration of a semiconductor testing device according to a fifth embodiment. Referring to FIG. 9, semiconductor testing device 110 according to the fifth embodiment is different from semiconductor testing device 110 according to the fourth embodiment illustrated in FIG. 8 in a connection relationship of testing device 110 to test object 200.

Semiconductor testing device 110 according to the fifth embodiment is connected between input electrodes 91 and 92 of test object 200. Specifically, probe 41 is connected to high-voltage input electrode 91, and probe 42 is connected to low-voltage input electrode 92.

(Operation of Semiconductor Testing Device)

Next, the operation of semiconductor testing device 110 according to the fifth embodiment will be described.

Figure 10:
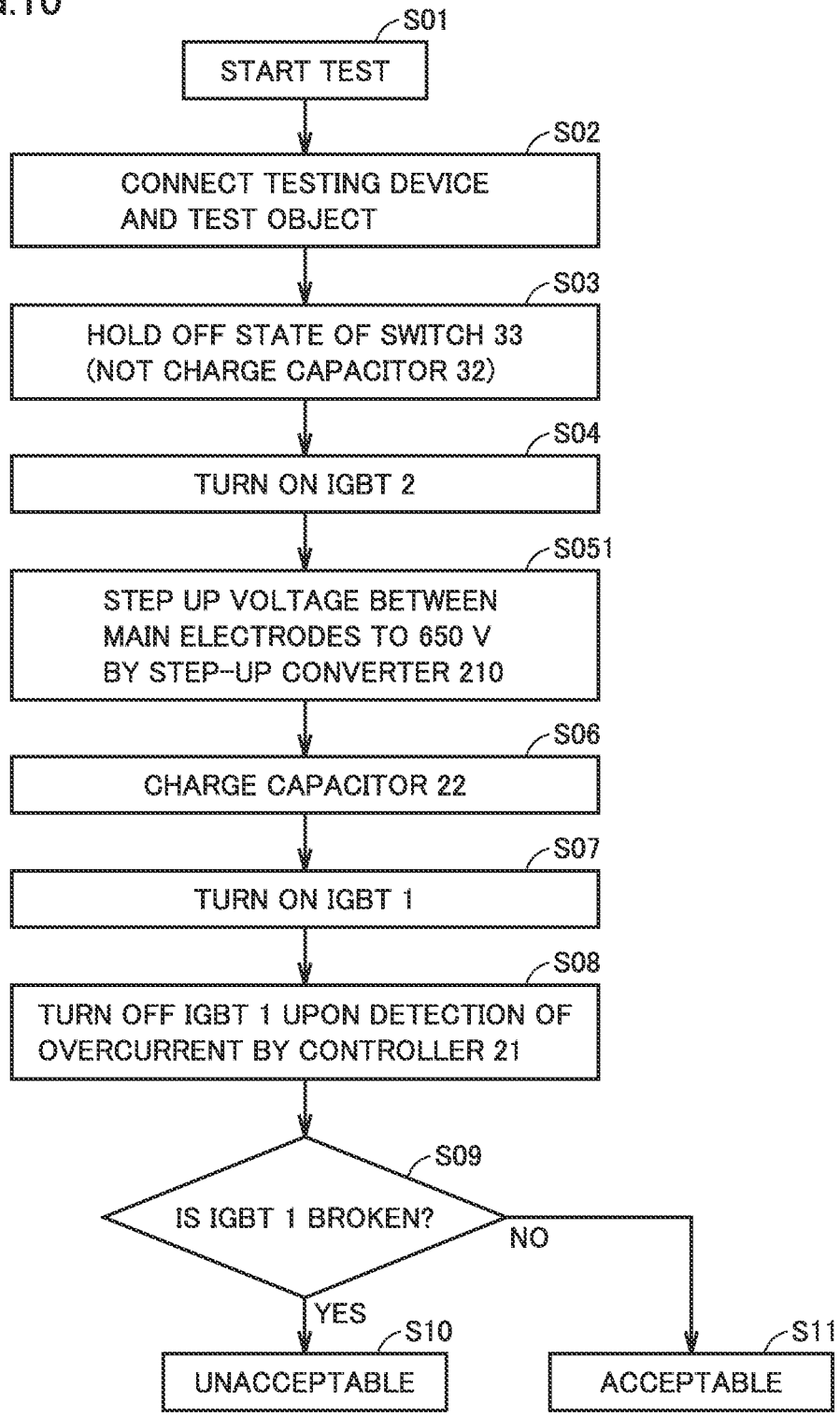
FIG. 10 is a flowchart for describing a processing procedure of a semiconductor testing method according to the fifth embodiment.

FIG. 10 is a flowchart for describing a processing procedure of a semiconductor testing method according to the fifth embodiment. FIG. 10 illustrates a processing procedure of the short circuit test when IGBT 1 is used as a subject.

The flowchart illustrated in FIG. 10 is obtained by replacing step S05 in the flowchart illustrated in FIG. 3 with step S051. In step S051, controller 21 steps up the DC voltage applied between input electrodes 91 and 92 to a target voltage (for example, 650 V) by controlling turning on and off of IGBTs 7 and 8 constituting step-up converter circuit 210. As a result, a DC voltage (for example, 650 V) for test is generated between main electrodes 51 and 52.

In step S06, capacitor 22 in test object 200 is charged upon receipt of the DC voltage generated between main electrodes 51 and 52. When capacitor 22 is charged upon receipt of the DC voltage (S06), controller 21 turns on IGBT 1 (S07), and detects the short-circuit current on the basis of the sense current of IGBT 1. When the sense current of IGBT 1 becomes greater than or equal to the threshold value, controller 21 turns off the IGBT 1 (S08 in), and determines whether IGBT 1 is broken on the basis of the sense current after turning off IGBT 1 (S09).

In the fifth embodiment, when IGBT 1 is turned on, most of the short-circuit current also flows through current path 61 illustrated in FIG. 9, and thus a large current can be prevented from flowing through testing device 110. Therefore, functions and effects similar to those of the semiconductor testing device and testing method according to the first embodiment can be obtained.

Furthermore, with testing device 110 according to the fifth embodiment, an avalanche test of test object 200 can be performed. The avalanche test is a test for evaluating resistance to avalanche breakdown caused by energy stored in the reactor flowing at once between the positive electrode and the negative electrode at the moment when the control signal input to the control electrode of the semiconductor switching element is transitioned from the H level to the L level.

Figure 11:
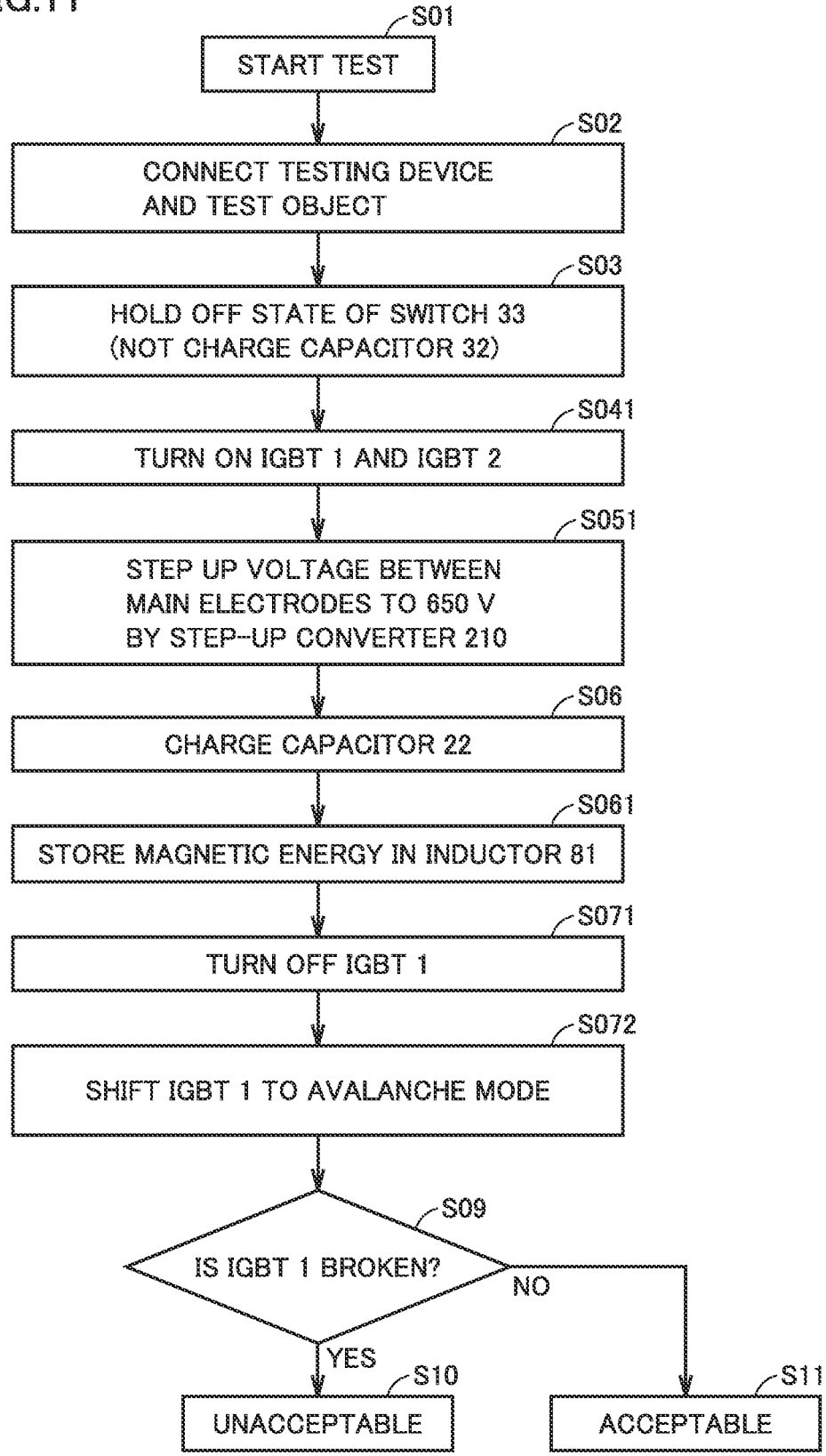
FIG. 11 is a flowchart for describing a processing procedure of the semiconductor testing method according to the fifth embodiment.

FIG. 11 illustrates a processing procedure of the avalanche test when IGBT 1 is used as a subject.

Referring to FIG. 11, when the avalanche test by testing device 110 is started in steps S01 to S03 as in FIG. 3, probes 41 and 42 of testing device 110 are connected to main electrodes 51 and 52 of test object 100, respectively, and thus test object 100 and testing device 110 are electrically connected. In this state, in step S03, by holding switch 33 in the off state, capacitor 32 is not charged.

Next, in step S041, controller 21 inputs an H-level control signal to the gate electrodes of IGBTs 1 and 2 to turn on IGBTs 1 and 2.

In step S051, controller 21 steps up the DC voltage applied between input electrodes 91 and 92 by controlling turning on and off of IGBTs 7 and 8 constituting step-up converter circuit 210 to generate a test voltage (for example, 650 V) between main electrodes 51 and 52.

In step S06, capacitor 22 in test object 200 is charged upon receipt of the DC voltage generated between main electrodes 51 and 52. In step S061, energy is stored in reactor 81.

Next, in step S071, controller 21 inputs an L-level control signal to the gate electrode of IGBT 1 to turn off IGBT 1. When IGBT 1 is turned off, the energy stored in reactor 81 increases the collector-emitter voltage of IGBT 1 to an avalanche voltage of the IGBT. As a result, IGBT 1 enters an avalanche mode. During the avalanche mode, the energy stored in reactor 81 is consumed by IGBT 1, and thus the emitter current of IGBT 1 decreases. When the avalanche breakdown does not occur in IGBT 1, the avalanche mode is continued until all the energy stored in reactor 81 is released, and the avalanche mode ends when the emitter current becomes 0.

On the other hand, when the avalanche breakdown occurs in IGBT 1 before all the energy stored in reactor 81 is released, the collector-emitter voltage of IGBT 1 decreases to near 0 V. Therefore, reactor 81 starts to store magnetic energy again, and the emitter current of IGBT 1 starts to rise.

Controller 21 monitors the emitter current of IGBT 1 on the basis of the sense current of IGBT 1 for a reference time in step S09. The reference time can be set on the basis of a result of dividing an inductance value of reactor 81 by a difference between the avalanche voltage of IGBT 1 and the power supply voltage. When the avalanche breakdown is detected within the reference time after IGBT 1 is turned off due to the increase in the emitter current (YES in S09), controller 21 determines that the dynamic characteristic of IGBT 1 is unacceptable in step S10. On the other hand, when the emitter current becomes 0, controller 21 determines that the avalanche breakdown has not occurred (NO in S09), and determines that the dynamic characteristic of IGBT 1 is acceptable in step S11.

As described above, in the semiconductor testing device and testing method according to the fifth embodiment, capacitor 22 connected between main electrodes 51 and 52 in test object 200 is charged, and the test of the subject is performed using the energy stored in capacitor 22. It is therefore possible to prevent a large current from flowing through the testing device when a short-circuit breakdown of the subject occurs.

Sixth Embodiment (Fourth Configuration Example of Test Object)

Figure 12:
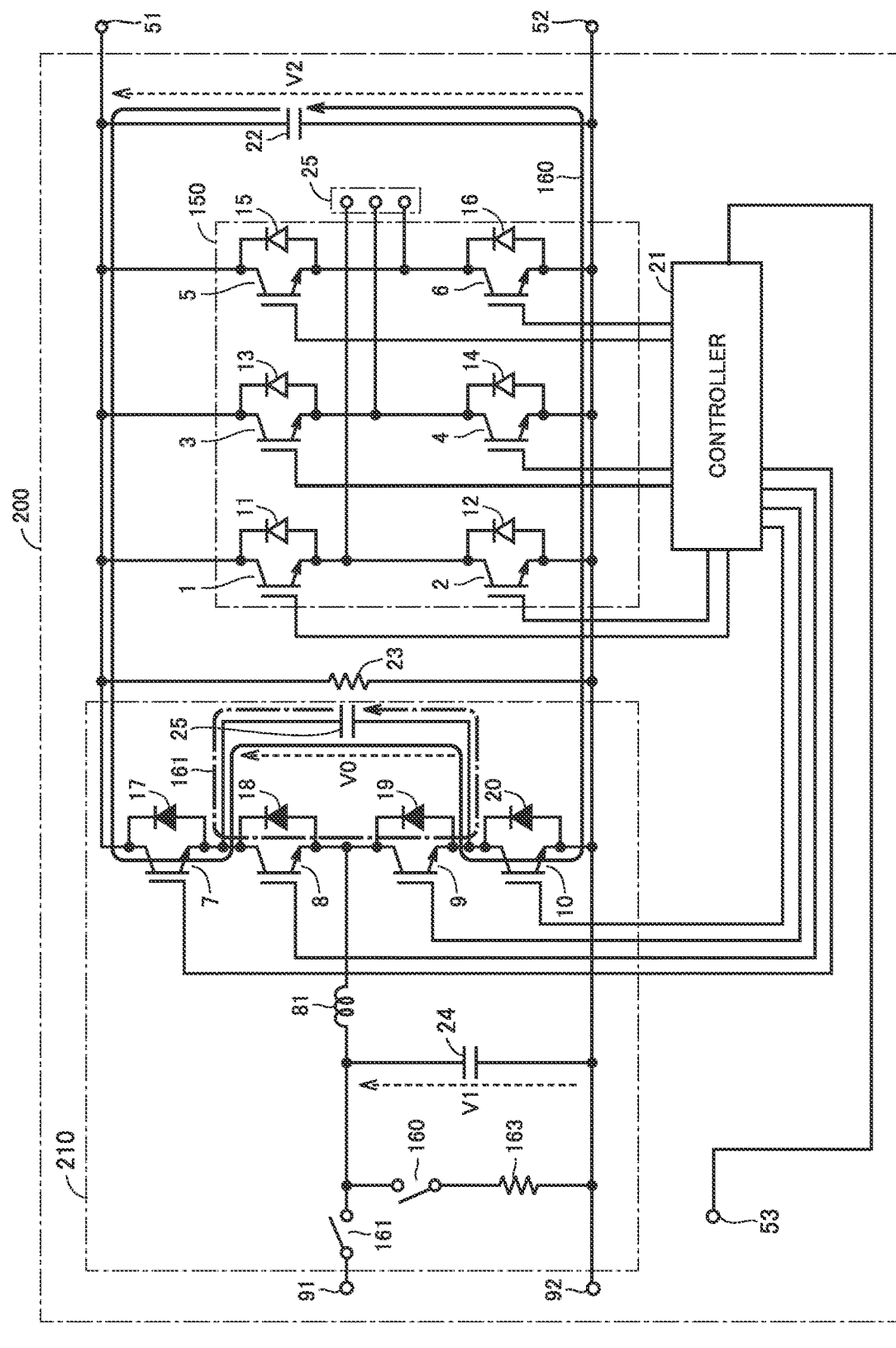
FIG. 12 is a circuit diagram illustrating a configuration of a semiconductor testing device according to a sixth embodiment.

FIG. 12 is a circuit diagram illustrating a configuration of a semiconductor testing device according to a sixth embodiment. Referring to FIG. 12, semiconductor testing device 110 according to the sixth embodiment is different from semiconductor testing device 110 according to the first embodiment illustrated in FIG. 1 in the configuration of the test object.

Test object 200 according to a fourth configuration example includes step-up converter circuit 210, switches 160 and 161, a discharge resistance 163, and input electrodes 91 and 92. Testing device 110 is connected between input electrodes 91 and 92. A power supply voltage VD of DC power supply 30 included in testing device 110 is, for example, about 500 V.

Step-up converter circuit 210 is called a multi-level chopper. Step-up converter circuit 210 includes semiconductor switching elements 7 to 10, diodes 17 to 20, reactor 81, and capacitors 24 and 25.

Similarly to semiconductor switching element 1 to 6, each of semiconductor switching elements 7 to 10 has a positive electrode, a negative electrode, and a control electrode, and is controllable of turning on and off in response to a control signal applied from controller 21 to the control electrode. In a configuration example in FIG. 12, semiconductor switching elements 7 to 10 are IGBTs. In the following description, semiconductor switching elements 7 to 10 are also referred to as IGBTs 7 to 10.

In step-up converter circuit 210, IGBT 7 to 10 are connected in series between high-voltage main electrode 51 and low-voltage main electrode 52. The collector electrode of IGBT 7 is connected to high-voltage main electrode 51. The emitter electrode of IGBT 8 and the collector electrode of IGBT 9 are connected to the first terminal of reactor 81. A second terminal of reactor 81 is connected to high-voltage input electrode 91. The emitter electrode of IGBT 10 is connected to low-voltage main electrode 52 and low-voltage input electrode 92. IGBTs 7 to 10 correspond to one example of "first semiconductor element", a "second semiconductor element", a "third semiconductor element", and a "fourth semiconductor element", respectively.

A first terminal of capacitor 24 is connected to the second terminal of reactor 81 and high-voltage input electrode 91, and a second terminal of capacitor 24 is connected to low-voltage input electrode 92. Capacitor 24 is a smoothing capacitor for reducing voltage fluctuation between input electrodes 91 and 92.

A first terminal of capacitor 25 is connected to the emitter electrode of IGBT 7 and the collector electrode of IGBT 8, and a second terminal of capacitor 25 is connected to the emitter electrode of IGBT 9 and the collector electrode of IGBT 10. Capacitor 25 is a charge pump configured to transition the stored charge to superimpose a voltage on an input voltage and step up the voltage. Capacitor 25 corresponds to one example of a "third capacitor".

A first terminal of switch 161 is connected to high-voltage input electrode 91, and a second terminal of switch 161 is connected to the second terminal of reactor 81. Switch 161 corresponds to one example of a "second switch". Switch 160 and discharge resistance 163 are connected in series between the second terminal of switch 161 and low-voltage input electrode 92.

Test object 200 according to the fourth configuration example is configured such that a DC voltage applied between input electrodes 91 and 92 is stepped up by step-up converter circuit 210 to a voltage capable of driving a load connected between main electrodes 51 and 52, and the stepped-up voltage is supplied to the load. Specifically, controller 21 calculates a duty ratio for setting an output voltage of step-up converter circuit 210 to a target voltage, and generates a control signal for controlling turning on and off of IGBTs 7 to 10 of step-up converter circuit 210 on the basis of the calculated duty ratio. Controller 21 inputs the generated control signal to the control electrodes of IGBTs 7 to 10.

(Operation of Semiconductor Testing Device)

Next, the operation of semiconductor testing device 110 according to the sixth embodiment will be described.

First, description will be made of a processing procedure when IGBT 7 is used as a subject and a short circuit test of IGBT 7 is performed as a dynamic characteristic test. During the short circuit test, IGBTs 8 and 9 are always in the off state.

Figure 13:
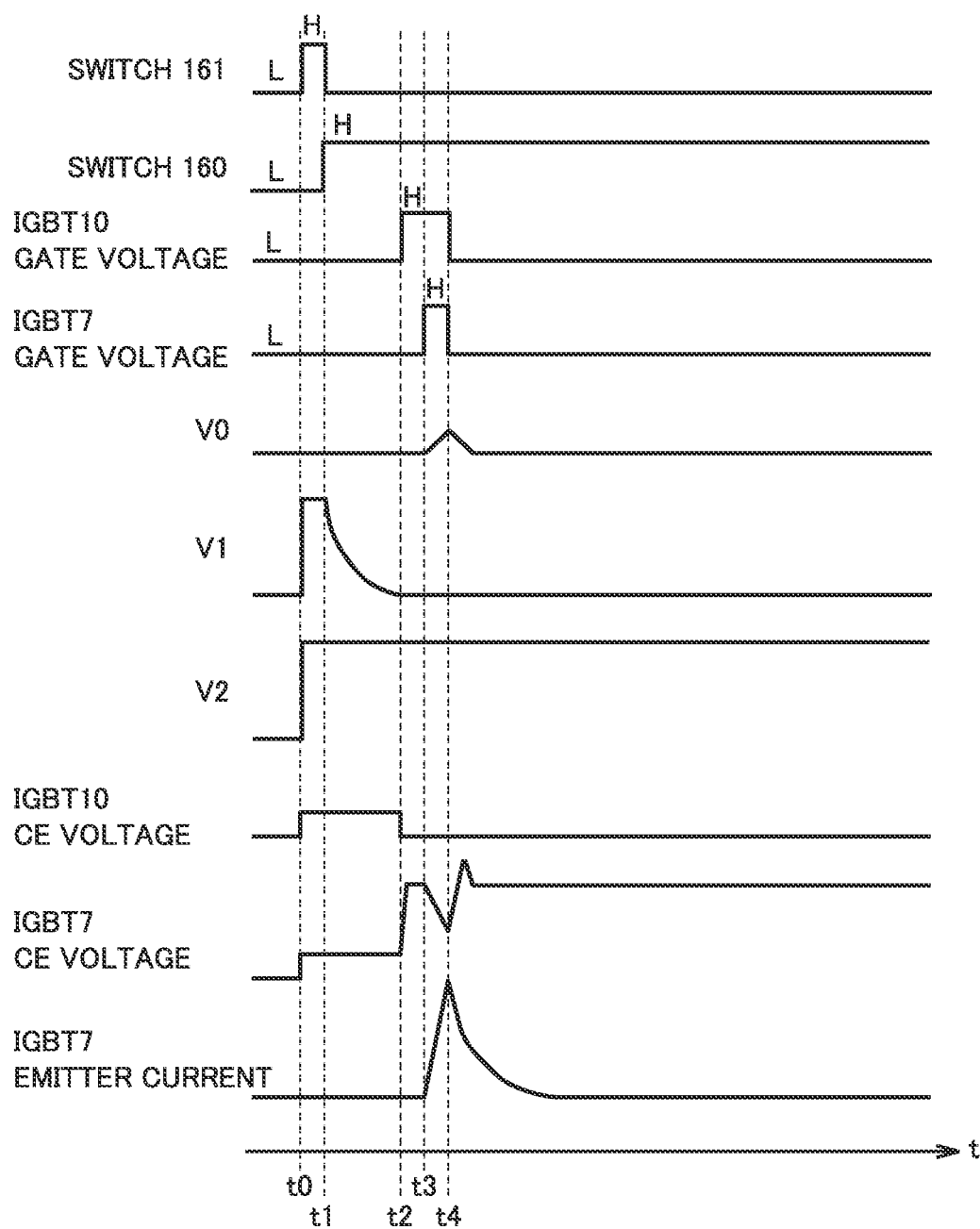
FIG. 13 is a timing chart for describing operation of a testing device and a test object in a short circuit test according to the sixth embodiment.

FIG. 13 is a timing chart for describing the operation of testing device 110 and test object 200 in the short circuit test according to the sixth embodiment. FIG. 13 illustrates waveforms of a gate voltage of switch 161, switch 160, and IGBT 10, a gate voltage of IGBT 7, an inter-terminal voltage V0 of capacitor 25, an inter-terminal voltage V1 of capacitor 24, an inter-terminal voltage V2 of capacitor 22, a collector-emitter (CE) voltage of IGBT 10, a CE voltage of IGBT 7, and an emitter current of IGBT 7 in order from the top. In the example in FIG. 13, similarly to the IGBTs, it is assumed that switches 161 and 160 are also turned off upon receipt of an L-level control signal and is turned on upon receipt of an H-level control signal.

Figure 14:
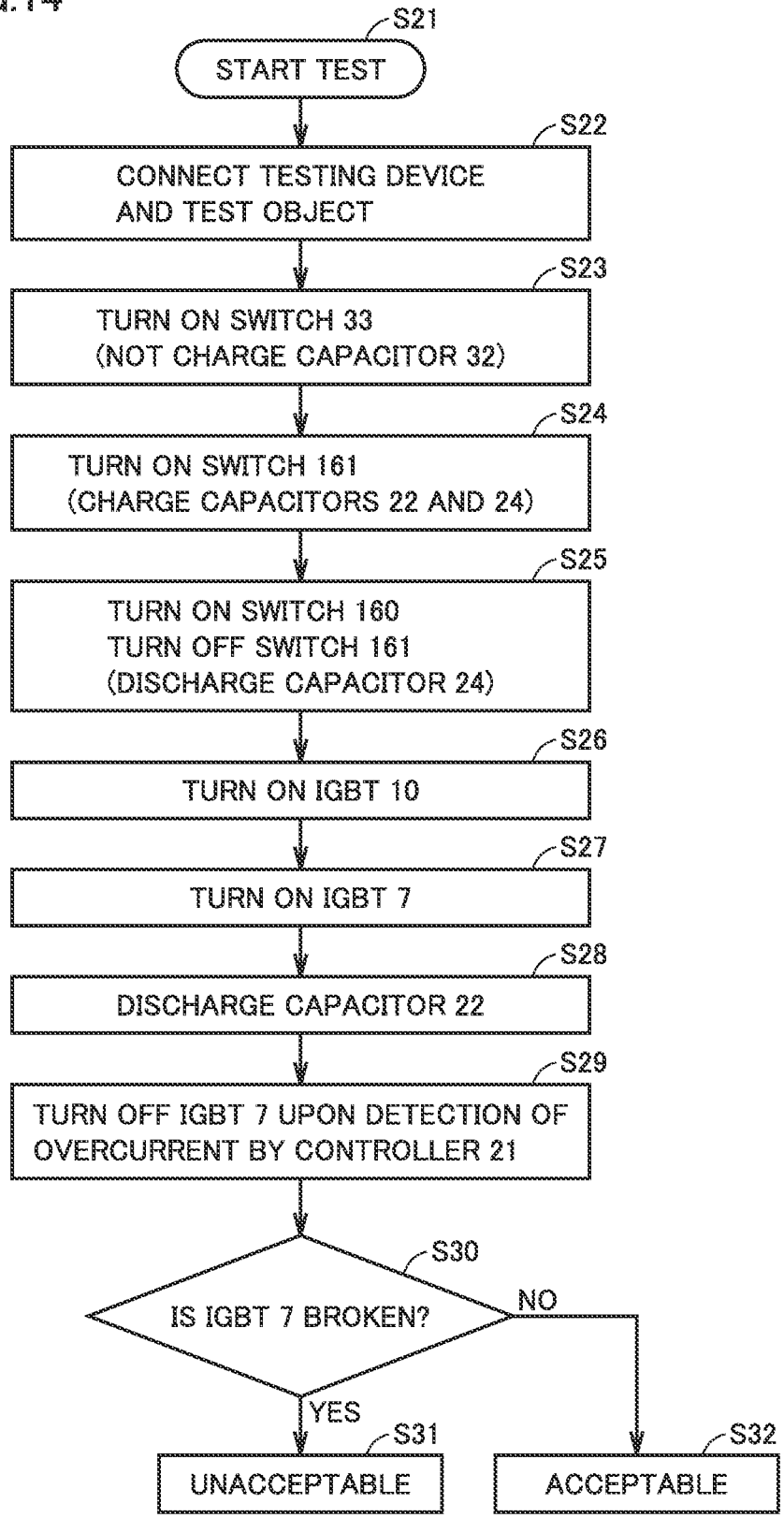
FIG. 14 is a flowchart for describing a processing procedure of the short circuit test according to the sixth embodiment.

FIG. 14 is a flowchart for describing a processing procedure of the short circuit test when IGBT 7 is used as a subject. The semiconductor testing method according to the sixth embodiment will be described with reference to FIGS. 13 and 14.

Referring to FIG. 14, when the short circuit test by testing device 110 is started in step S21, probes 41 and 42 of testing device 110 are connected to input electrodes 91 and 92 of test object 200, respectively, in step S22, and thus test object 200 and testing device 110 are electrically connected. Controller 21 and controller 31 are communicably connected by connecting probe 43 of testing device 110 to control terminal 53 of test object 200. In this state, in step S23, controller 31 does not charge capacitor 32 by holding switch 33 in the off state.

Next, in step S24, controller 21 receives a command from controller 31 and inputs an H-level control signal to switch 161 to turn on switch 161 (time t0 in FIG. 13). When switch 161 enters the on state, capacitors 24 and 22 in test object 200 are charged upon receipt of DC voltage VD applied between input electrodes 91 and 92. As a result, inter-terminal voltages V1 and V2 of capacitors 24 and 22 increase to establish V1=V2=DC voltage VD.

When capacitors 24 and 22 are charged, controller 21 turns off switch 161 and turns on switch 160 in step S25 (time t1 in FIG. 13). When switch 161 is turned off, test object 200 and testing device 110 are electrically cut off. When switch 160 is turned on in this state, discharge of capacitor 24 is started. However, capacitor 22 is not discharged by diode 17.

Next, in step S26, controller 21 receives a command from controller 31 and inputs an H-level control signal to the gate electrode of IGBT 10 to turn on IGBT 10 (time t2 in FIG. 13). When IGBT 10 is turned on, the CE voltage of IGBT 7 becomes equal to DC voltage VD. When IGBT 10 is in the on state, in step S27, controller 21 receives a command from controller 31 and inputs an H-level control signal to the gate electrode of IGBT 7 to turn on IGBT 7 (time t3 in FIG. 13).

When both IGBTs 7 and 10 are turned on to short-circuit main electrodes 51 and 52, discharge of capacitor 22 is started in step S28. Due to the charge stored in capacitor 22, a short-circuit current starts to flow between main electrodes 51 and 52. The short-circuit current flows from the positive electrode of capacitor 22 to the negative electrode of capacitor 22 via IGBT 7, capacitor 25, and IGBT 10 through a current path 160 indicated by a solid line in FIG. 12.

Controller 21 monitors the emitter current of IGBT 7 on the basis of the sense current of IGBT 7. When the sense current becomes greater than or equal to the threshold value, controller 21 detects an overcurrent of IGBT 7. In this case, in step S29, controller 21 causes the control signal input to the gate electrode of IGBT 7 to transition from the H level to the L level to turn off IGBT 7 (time t4 in FIG. 13).

When the sense current continues to increase due to IGBT 7 being not turned off upon receipt of the L-level control signal, controller 21 determines that IGBT 7 has been broken (YES in S30), and determines that the dynamic characteristic of IGBT 7 is unacceptable in step S31. On the other hand, when the sense current decreases due to IGBT 7 being normally turned off, controller 21 determines that IGBT 7 is not broken (NO in S30), and determines that the dynamic characteristic of IGBT 7 is acceptable in step S32.

When the short circuit test is performed using IGBT 10 as the subject, IGBT 7 is to be replaced with IGBT 10 and IGBT 10 is to be replaced with IGBT 7 in the above description. However, in a case where capacitor 24 is not discharged at time t1 in FIG. 13, capacitor 25 is charged at time t2, and the short circuit test cannot be performed.

Next, description will be made of a processing procedure when IGBT 8 is used as a subject and a short circuit test of IGBT 8 is performed as a dynamic characteristic test.

Figure 15:
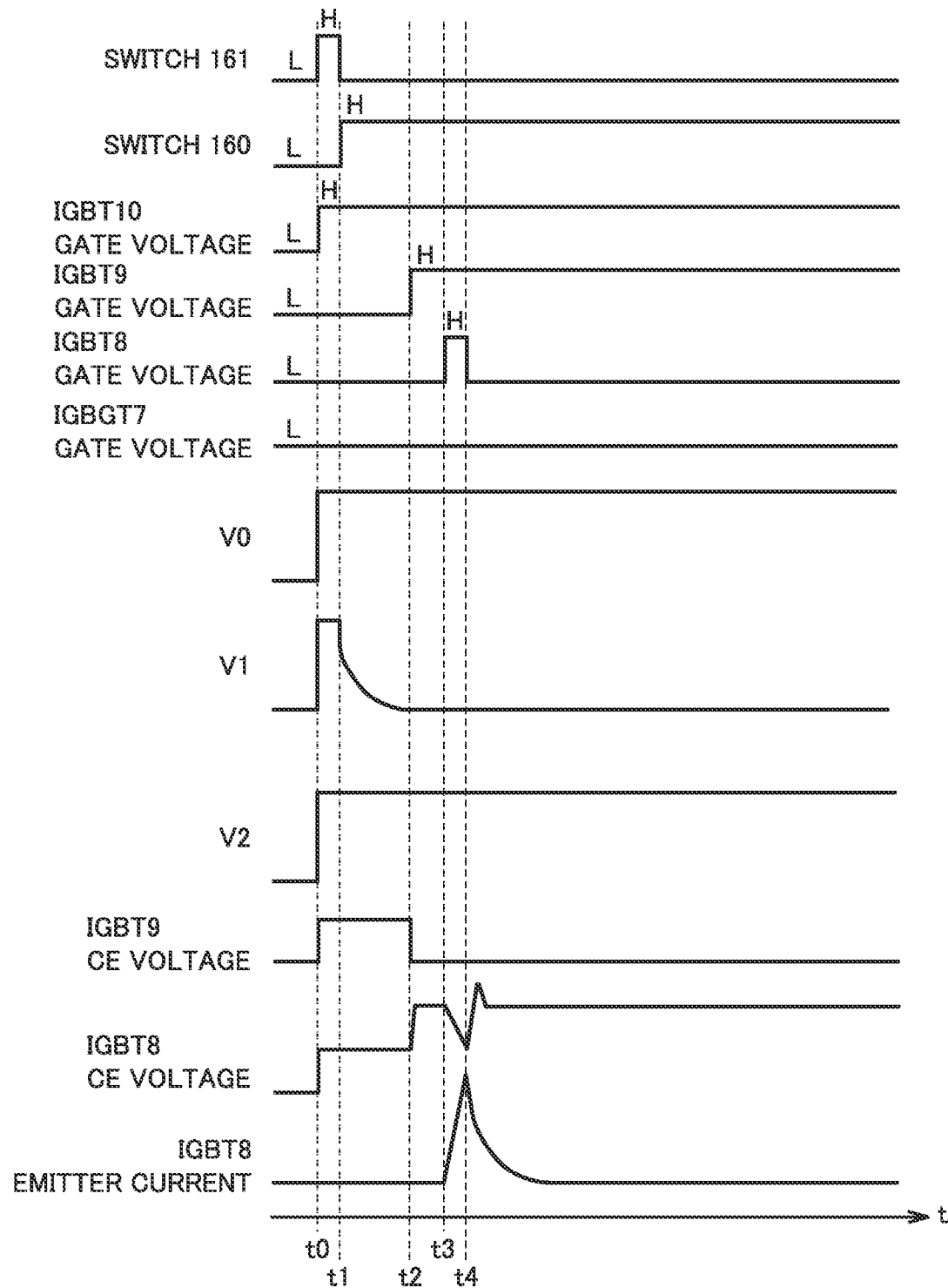
FIG. 15 is a timing chart for describing operation of the testing device and the test object in the short circuit test according to the sixth embodiment.

FIG. 15 is a timing chart for describing the operation of testing device 110 and test object 200 in the short circuit test according to the sixth embodiment. FIG. 15 illustrates waveforms of a gate voltage of switch 161, switch 160, and IGBT 10, a gate voltage of IGBT 9, a gate voltage of IGBT 8, a gate voltage of IGBT 7, inter-terminal voltage V0 of capacitor 25, inter-terminal voltage V1 of capacitor 24, inter-terminal voltage V2 of capacitor 22, a CE voltage of IGBT 9, a CE voltage of IGBT 8, and an emitter current of IGBT 8 in order from the top. In the example in FIG. 15, similarly to the IGBTs, it is assumed that switches 161 and 160 are also turned off upon receipt of an L-level control signal and is turned on upon receipt of an H-level control signal.

Figure 16:
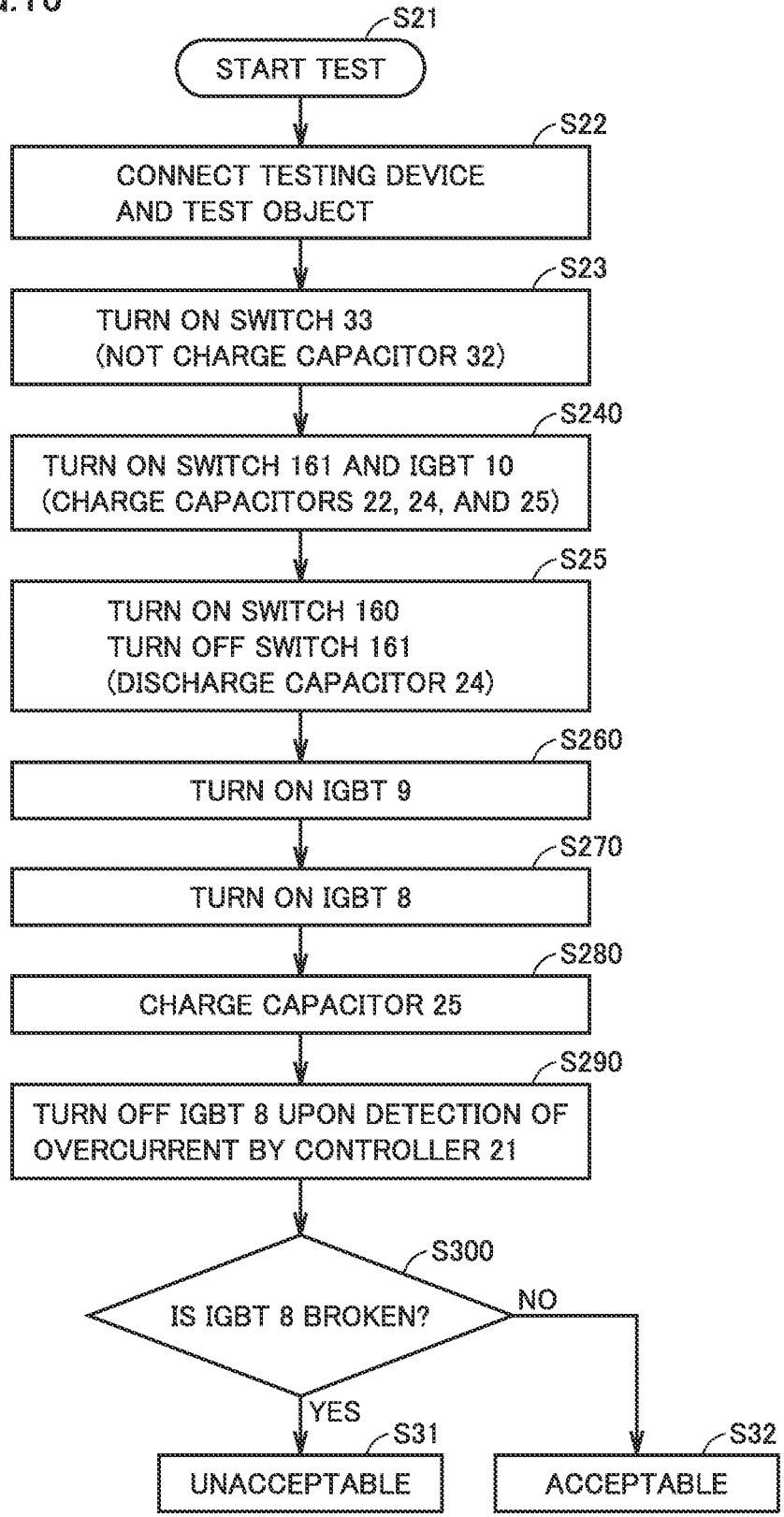
FIG. 16 is a flowchart for describing a processing procedure of the short circuit test according to the sixth embodiment.

FIG. 16 is a flowchart for describing a processing procedure of the short circuit test when IGBT 8 is used as a subject. The semiconductor testing method according to the sixth embodiment will be described with reference to FIGS. 15 and 16.

Referring to FIG. 16, when the short circuit test by testing device 110 is started in step S21, probes 41 and 42 of testing device 110 are connected to input electrodes 91 and 92 of test object 200, respectively, in step S22, and thus test object 200 and testing device 110 are electrically connected. Controller 21 and controller 31 are communicably connected by connecting probe 43 of testing device 110 to control terminal 53 of test object 200. In this state, in step S23, controller 31 does not charge capacitor 32 by holding switch 33 in the off state.

Next, in step S240, controller 21 receives a command from controller 31 and inputs an H-level control signal to switch 161 to turn on switch 161. Controller 21 further receives a command from controller 31 and inputs an H-level control signal to the gate electrode of IGBT 10 to turn on IGBT 10 (time t0 in FIG. 15). When switch 161 and IGBT 10 enter the on state, capacitors 25, 24, and 22 in test object 200 are charged upon receipt of DC voltage VD applied between input electrodes 91 and 92. As a result, inter-terminal voltages V0, V1, and V2 of capacitors 25, 24, and 22 increase to establish V0=V1=V2=DC voltage VD.

When capacitors 25, 24, and 22 are charged, controller 21 turns off switch 161 and turns on switch 160 in step S25 (time t1 in FIG. 15). When switch 160 enters the on state instead of switch 161, discharge of capacitor 24 is started. However, capacitor 22 is not discharged by diode 17. Capacitor 25 is not discharged by diode 18.

Next, in step S260, controller 21 receives a command from controller 31 and inputs an H-level control signal to the gate electrode of IGBT 9 to turn on IGBT 9 (time t2 in FIG. 15). When IGBT 9 is turned on, the CE voltage of IGBT 8 becomes equal to DC voltage VD. When IGBT 9 is in the on state, in step S270, controller 21 receives a command from controller 31 and inputs an H-level control signal to the gate electrode of IGBT 8 to turn on IGBT 8 (time t3 in FIG. 15).

When both IGBTs 8 and 9 are turned on to short-circuit the terminals of capacitor 25, discharge of capacitor 25 is started in step S28. Due to the charge stored in capacitor 25, a short-circuit current starts to flow between IGBT 8 and 9. The short-circuit current flows from the positive electrode of capacitor 25 to the negative electrode of capacitor 25 via IGBTs 8 and 9 through a current path 161 indicated by a broken line in FIG. 15.

Controller 21 monitors the emitter current of IGBT 8 on the basis of the sense current of IGBT 8. When the sense current becomes greater than or equal to the threshold value, controller 21 detects an overcurrent of IGBT 8. In this case, in step S290, controller 21 causes the control signal input to the gate electrode of IGBT 8 to transition from the H level to the L level to turn off IGBT 8 (time t4 in FIG. 15).

When the sense current continues to increase due to IGBT 8 being not turned off upon receipt of the L-level control signal, controller 21 determines that IGBT 8 has been broken (YES in S300), and determines that the dynamic characteristic of IGBT 8 is unacceptable in step S31. On the other hand, when the sense current decreases due to IGBT 8 being normally turned off, controller 21 determines that IGBT 8 is not broken (NO in S300), and determines that the dynamic characteristic of IGBT 8 is acceptable in step S32.

When the short circuit test is performed using IGBT 9 as the subject, IGBT 8 is to be replaced with IGBT 9 and IGBT 9 is to be replaced with IGBT 8 in the above description. However, in a case where capacitor 24 is not discharged at time t1 in FIG. 15, when IGBT 9 is turned on at time t2, the charge of capacitor 24 moves to establish V1+V0=V2. When the capacitances of capacitors 22, 23, and 24 are the same, V0=VD/2. In this case, since the short-circuit current becomes ½ of an original short-circuit current, an accurate short circuit test cannot be performed.

As described above, in the semiconductor testing device and testing method according to the sixth embodiment, capacitor 22 connected between main electrodes 51 and 52 in test object 200 having a multi-level chopper including IGBTs 7 to 10 connected in series between main electrodes 51 and 52 and capacitor 25 for charge pump is charged, and the test of the IGBT 7 or 10 is performed using the energy stored in capacitor 22. It is therefore possible to prevent a large current from flowing through the testing device when a short-circuit breakdown of the subject occurs.

In the above configuration, capacitor 25 in test object 200 is charged, and the test of the IGBT 8 or 9 is performed using the energy stored in capacitor 25. It is therefore possible to prevent a large current from flowing through the testing device when a short-circuit breakdown of the subject occurs.

(Other Configuration Examples)

Figure 17:
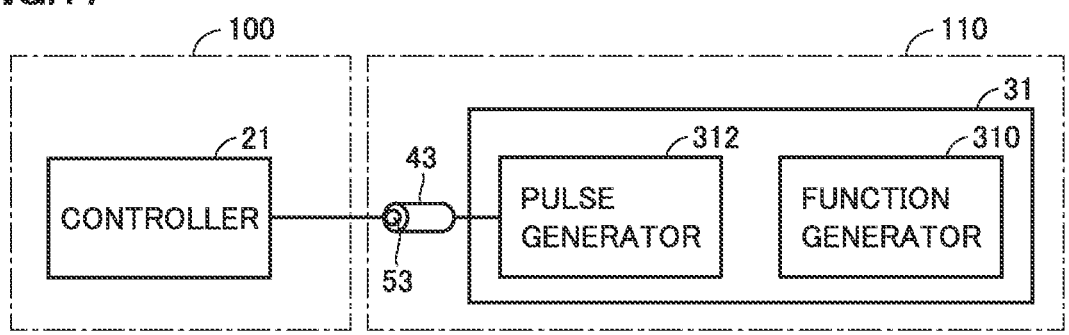
FIG. 17 is a block diagram illustrating a first configuration example of a controller of the semiconductor testing device.

In semiconductor testing device 110 according to the first to sixth embodiments, controller 31 can be configured using a function generator 310 and a pulse generator 312 as illustrated in FIG. 17. In a first configuration example illustrated in FIG. 17, function generator 310 generates a signal voltage having a desired waveform and/or a desired frequency. Pulse generator 312 generates a control signal for controlling three-phase inverter circuit 150 (including step-up converter circuit 210) of test object 100 (or 200) on the basis of the signal voltage generated by function generator 310, and transmits the generated control signal to controller 21.

Figure 18:
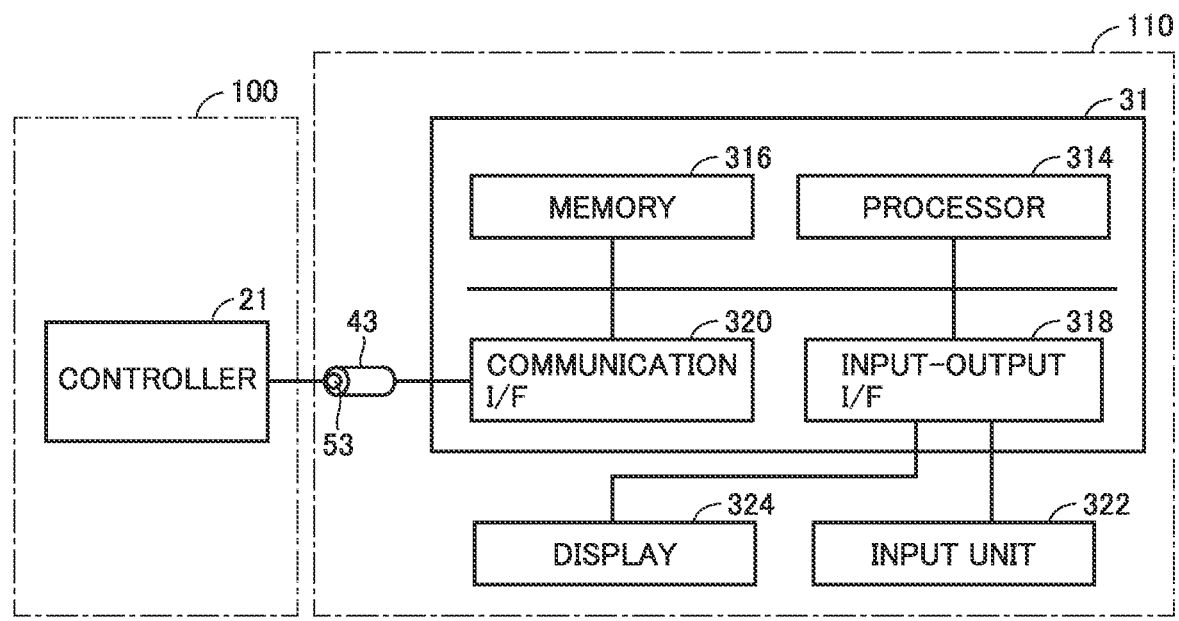
FIG. 18 is a block diagram illustrating a second configuration example of a controller of the semiconductor testing device.

Alternatively, as in a second configuration example illustrated in FIG. 18, controller 31 may include a processor 314, a memory 316, an input-output interface (I/F) 318, and a communication I/F 320. These components are communicably connected to each other via a bus (not shown).

Processor 314 is typically an arithmetic processor such as a central processing unit (CPU) or a micro processing unit (MPU). Processor 314 reads and executes a program stored in memory 316 to control operation of each component of testing device 110.

The control is implemented by a nonvolatile memory such as memory 316, a random access memory (RAM), a read only memory (ROM), and a flash memory. Memory 316 stores the program executed by processor 314, data used by processor 314, or the like.

Input-output I/F 318 is an interface for exchanging various data between processor 314 and a display 324 and an input unit 322. Display 324 includes a liquid crystal panel capable of displaying an image. Input unit 322 receives an operation input by a user to testing device 110. Input unit 322 typically includes a touch panel, a keyboard, a mouse, and the like.

Communication I/F 320 is a communication interface for exchanging various data between testing device 110 and other devices including test object 100 or 200, and is implemented by an adapter, a connector, or the like. Note that a communication method may be a wireless communication method using a wireless local area network (LAN) or the like, or may be a wired communication method using a universal serial bus (USB) or the like.

Seventh Embodiment

In a seventh embodiment, a manufacturing method for a semiconductor device to be test object 100 or 200 in the first to sixth embodiments will be described. In other words, in the seventh embodiment, description will be made of a manufacturing method for a semiconductor device including the semiconductor testing method according to the first to fifth embodiments in a manufacturing process.

The semiconductor device manufactured by the manufacturing method includes a semiconductor switching element, and test objects 100 and 200 according to the first configuration example (see FIG. 1), the second configuration example (see FIG. 7), the third configuration example (see FIG. 8), and the fourth configuration example (see FIG. 12) can be applied. In the following description, the semiconductor device is assumed to be test object 100 according to the first configuration example (see FIG. 1). That is, the semiconductor device includes full-bridge three-phase inverter circuit 150, controller 21, capacitor 22, and discharge resistance 23.

FIG. 19 is a flowchart illustrating a manufacturing method for the semiconductor device according to the sixth embodiment.

Referring to FIG. 19, the manufacturing method for a semiconductor device includes a step of assembling a semiconductor device (S100), a step of testing the dynamic characteristic of the assembled semiconductor device (S200), and a step of commercializing a semiconductor device that is accepted in the test (S300).

The step of assembling a semiconductor device (S100) includes a step of manufacturing three-phase inverter circuit 150 (S110), a step of manufacturing controller 21 (S120), a step of mounting the manufactured three-phase inverter circuit 150, controller 21, discharge resistance 23, and capacitor 22 (S130), and a step of wiring mounted three-phase inverter circuit 150, controller 21, discharge resistance 23, and capacitor 22 (S140).

In the step of manufacturing three-phase inverter circuit 150 (S110), semiconductor switching elements (IGBTs) 1 to 6 and diodes 11 to 16 are mounted on a substrate.

In the step of manufacturing controller 21 (S120), the function generator (or microcomputer) constituting controller 21, a gate drive circuit of the semiconductor switching element, and the like are mounted on the substrate.

In the step of mounting (S130), the substrate on which three-phase inverter circuit 150 is manufactured and the substrate on which controller 21 is manufactured are mounted on a housing of the semiconductor device. Discharge resistance 23 and capacitor 22 are further mounted on the housing.

In the step of wiring (S140), three-phase inverter circuit 150, controller 21, discharge resistance 23, and capacitor 22 are electrically connected to each other by connecting the electrode on the substrate mounted on the housing, discharge resistance 23, and capacitor 22 by wires. Thus, semiconductor device (test object 100) illustrated in FIG. 1 is assembled.

Note that, in the step of assembling a semiconductor device (S100), a test for confirming the functions of three-phase inverter circuit 150, controller 21, and the like manufactured individually is performed, and components that are accepted in the test are mounted on the housing of the semiconductor device. Alternatively, three-phase inverter circuit 150 and controller 21 may be directly manufactured in the housing of the semiconductor device instead of being individually manufactured. In the latter configuration as compared with the former configuration, the work of testing each component can be omitted, and man-hours can be reduced, but there is a possibility that a defect rate may be deteriorated. Therefore, it is only required to compare an increase in a cost rate due to an increase in the man-hours with an increase in a cost rate due to deterioration in the defect rate, and to adopt a configuration with a lesser increase.

Next, in the step of testing (S200), a characteristic test is performed using the assembled semiconductor device as a test object. In this step (S200), the characteristic test of the semiconductor device is performed in accordance with the processing procedure described with reference to FIG. 3. That is, when semiconductor testing device 110 (see FIG. 1) is electrically connected to the semiconductor device, the dynamic characteristic test (such as a short circuit test) of the semiconductor switching element to be a subject is performed.

Next, in the step of commercialization (S300), first, it is determined whether a test result in the step of testing (S200) is acceptable or unacceptable (S310). Next, for the semiconductor device whose test result is acceptable (YES in S310), a step of attaching an upper lid to the housing (S320) is performed. As a result, the housing of the semiconductor device is sealed to be a product. At this time, the semiconductor device whose test result is unacceptable (NO in S310) is excluded. The commercialized semiconductor device is shipped in the step of shipping (S330).

In the step of testing the semiconductor device (S200) in the manufacturing method for the semiconductor device illustrated in FIG. 19, as described in the first embodiment, capacitor 22 connected between main electrodes 51 and 52 in the semiconductor device is charged in advance, and the characteristic test of the subject is performed using the energy stored in capacitor 22. This makes it possible to prevent a large current from flowing through the semiconductor testing device when the subject is broken during the test. As a result, it is possible to suppress the progress of damage to the semiconductor testing device due to a breakdown current of the semiconductor element.

Note that, in the present disclosure, each embodiment can be combined, and each embodiment can be appropriately modified or omitted within the scope of the disclosure.

It should be understood that the embodiments disclosed herein are illustrative in all respects and not restrictive. The scope of the present disclosure is defined not by the above description but by the claims, and is intended to include meanings equivalent to the claims and all modifications within the scope.

REFERENCE SIGNS LIST 1 to 10: semiconductor switching element, 11 to 18: diode, 25: three-phase output electrode, 21, 31: controller, 22, 32: capacitor, 23, 163: discharge resistance, 30: DC power supply, 33, 160, 161: switch, 41 to 43: probe, 51, 52: main electrode, 53: control terminal, 61, 62: current path, 81: reactor, 91, 92: input electrode, 100, 200: test object, 110: semiconductor testing device (testing device), 150: three-phase inverter circuit, 210: step-up converter circuit, 310: function generator, 312:

pulse generator, 314: processor, 316: memory, 318: input-output I/F, 320: communication I/F, 322: input unit, 324: display

The invention claimed is:

1. A semiconductor testing device to test a characteristic of a test object including a first semiconductor element, wherein the first semiconductor element includes a positive electrode, a negative electrode, and a control electrode, and is turned on or off in response to a first control signal input to the control electrode, the test object further includes a first main electrode electrically connected to the positive electrode of the first semiconductor element, a second main electrode electrically connected to the negative electrode of the first semiconductor element, and a first capacitor electrically connected between the first main electrode and the second main electrode, the semiconductor testing device comprises:

a first probe and a second probe;

a DC power supply electrically connected between the first probe and the second probe; and a controller to generate the first control signal, when the first probe is connected to the first main electrode and the second probe is connected to the second main electrode, the controller charges the first capacitor with a DC voltage supplied from the DC power supply, and the controller inputs, to the control electrode of the first semiconductor element, the first control signal for turning on the first semiconductor element, after the first capacitor is charged, a first switch and a second capacitor electrically connected in series between the first probe and the second probe, wherein when the first probe is connected to the first main electrode and the second probe is connected to the second main electrode, the controller charges the first capacitor while holding the first switch in an off state.

2. The semiconductor testing device according to claim 1, wherein an electrostatic capacitance of the second capacitor is larger than an electrostatic capacitance of the first capacitor.

3. The semiconductor testing device according to claim 1, wherein the test object further includes a second semiconductor element electrically connected in series to the first semiconductor element between the first main electrode and the second main electrode, the second semiconductor element includes a positive electrode, a negative electrode, and a control electrode, and is turned on or off in response to a second control signal input to the control electrode, when the first probe is connected to the first main electrode and the second probe is connected to the second main electrode, the controller inputs the second control signal for turning on the second semiconductor element to the control electrode of the second semiconductor element, and the controller inputs, to the control electrode of the first semiconductor element, the first control signal for turning on the first semiconductor element, after the first capacitor is charged and the second semiconductor element is turned on.

4. The semiconductor testing device according to claim 1, wherein the test object further includes a first input electrode, a second input electrode, and a step-up converter circuit to step up a DC voltage input between the first input electrode and the second input electrode and output the DC voltage between the first main electrode and the second main electrode, when the first probe is connected to the first main electrode and the second probe is connected to the second main electrode, the controller controls the step-up converter circuit to charge the first capacitor with a voltage obtained by stepping up the DC voltage supplied from the DC power supply, and the controller inputs, to the control electrode of the first semiconductor element, the first control signal for turning on the first semiconductor element, after the first capacitor is charged.

5. The semiconductor testing device according to claim 3, wherein the test object further includes a first input electrode, a second input electrode, and a step-up converter circuit to step up a DC voltage input between the first input electrode and the second input electrode with energy stored in a reactor and output the DC voltage between the first main electrode and the second main electrode, when the first probe is connected to the first input electrode and the second probe is connected to the second input electrode, the controller inputs the first control signal for turning on the first semiconductor element to the control electrode of the first semiconductor element and inputs the second control signal for turning on the second semiconductor element to the control electrode of the second semiconductor element, the controller controls the step-up converter circuit to charge the first capacitor with a voltage obtained by stepping up the DC voltage supplied from the DC power supply, and the controller inputs, to the control electrode of the first semiconductor element, the first control signal for turning off the first semiconductor element, after the first capacitor is charged.

6. The semiconductor testing device according to claim 1, wherein the test object further includes a first input electrode on a high-voltage side, a second input electrode on a low-voltage side, the second input electrode being connected to the second main electrode, a second semiconductor element, a third semiconductor element, and a fourth semiconductor element electrically connected in series to the first semiconductor element between the first main electrode and the second main electrode, and first to fourth diodes connected in anti-parallel to the first semiconductor element, the second semiconductor element, the third semiconductor element, and the fourth semiconductor element, respectively, the second semiconductor element, the third semiconductor element, and the fourth semiconductor element each have a positive electrode, a negative electrode, and a control electrode, and are turned on or off in response to a second control signal, a third control signal, and a fourth control signal input to the control electrode, respectively, the test object further includes a third capacitor connected between (i) the negative electrode of the first semiconductor element and the positive electrode of the second semiconductor element, and (ii) the negative electrode of the third semiconductor element and the positive electrode of the fourth semiconductor element, and a reactor and a second switch electrically connected in series between (i) the negative electrode of the second semiconductor element and the positive electrode of the third semiconductor element, and (ii) the first input electrode, when the first probe is connected to the first input electrode and the second probe is connected to the second input electrode, the controller charges the first capacitor by turning on the second switch, the controller turns off the second switch after charging the first capacitor and inputs, to the control electrode of the fourth semiconductor element, the fourth control signal for turning on the fourth semiconductor element, and the controller inputs, to the control electrode of the first semiconductor element, the first control signal for turning on the first semiconductor element, after the fourth semiconductor element is turned on.

7. The semiconductor testing device according to claim 6, wherein when the first probe is connected to the first input electrode and the second probe is connected to the second input electrode, the controller turns on the second switch and inputs the fourth control signal for turning on the fourth semiconductor element to the control electrode of the fourth semiconductor element, the controller turns off the second switch after charging the first capacitor and the third capacitor and inputs, to the control electrode of the third semiconductor element, the third control signal for turning on the third semiconductor element, and the controller inputs, to the control electrode of the second semiconductor element, the second control signal for turning on the second semiconductor element after the third semiconductor element is turned on.

8. The semiconductor testing device according to claim 1, wherein the second capacitor is not charged when the first switch is in the off state.

9. A semiconductor testing method to test a characteristic of a test object including a first semiconductor element, wherein the first semiconductor element includes a positive electrode, a negative electrode, and a control electrode, and is turned on or off in response to a first control signal input to the control electrode, the test object further includes a first main electrode electrically connected to the positive electrode of the first semiconductor element, a second main electrode electrically connected to the negative electrode of the first semiconductor element, a first capacitor electrically connected between the first main electrode and the second main electrode, a series circuit of a second capacitor and a first switch is electrically connected between a positive electrode and a negative electrode of the DC power supply, and the charging of the first capacitor includes charging the first capacitor while holding the first switch in an off state, and the semiconductor testing method comprises:

charging the first capacitor with a DC voltage supplied from a DC power supply electrically connected between the first main electrode and the second main electrode; and inputting, to the control electrode of the first semiconductor element, the first control signal for turning on the first semiconductor element, after charging the first capacitor.

10. The semiconductor testing method according to claim 9, wherein the test object further includes a second semiconductor element electrically connected in series to the first semiconductor element between the first main electrode and the second main electrode, the second semiconductor element includes a positive electrode, a negative electrode, and a control electrode, and is turned on or off in response to a second control signal input to the control electrode, the semiconductor testing method further comprises inputting the second control signal for turning on the second semiconductor element to the control electrode of the second semiconductor element, and the inputting of the first control signal to the control electrode of the first semiconductor element includes inputting, to the control electrode of the first semiconductor element, the first control signal for turning on the first semiconductor element, after the first capacitor is charged and the second semiconductor element is turned on.

11. The semiconductor testing method according to claim 9, wherein the test object further includes a first input electrode, a second input electrode, and a step-up converter circuit to step up a DC voltage input between the first input electrode and the second input electrode and output the DC voltage between the first main electrode and the second main electrode, and the charging of the first capacitor includes controlling the step-up converter circuit to charge the first capacitor with a voltage obtained by stepping up the DC voltage supplied from the DC power supply.

12. The semiconductor testing method according to claim 10, wherein the test object further includes a first input electrode, a second input electrode, and a step-up converter circuit to step up a DC voltage input between the first input electrode and the second input electrode with energy stored in a reactor and output the DC voltage between the first main electrode and the second main electrode, and the semiconductor testing method further comprises:

inputting the first control signal for turning on the first semiconductor element to the control electrode of the first semiconductor element and inputting the second control signal for turning on the second semiconductor element to the control electrode of the second semiconductor element;

controlling the step-up converter circuit to charge the first capacitor with a voltage obtained by stepping up the DC voltage supplied from the DC power supply; and inputting, to the control electrode of the first semiconductor element, the first control signal for turning off the first semiconductor element, after charging the first capacitor.

13. The semiconductor testing method according to claim 9, wherein
the test object further includes
a first input electrode on a high-voltage side,
a second input electrode on a low-voltage side, the second input electrode being connected to the second main electrode,
a second semiconductor element, a third semiconductor element, and a fourth semiconductor element electrically connected in series to the first semiconductor element between the first main electrode and the second main electrode, and each of the first semiconductor element, the second semiconductor element, the third semiconductor element, and the fourth semiconductor element includes a diode connected in anti-parallel,
the second semiconductor element, the third semiconductor element, and the fourth semiconductor element each have a positive electrode, a negative electrode, and a control electrode, and are turned on or off in response to a second control signal, a third control signal, and a fourth control signal input to the control electrode, respectively,
the test object further includes
a third capacitor having a first terminal connected to the negative electrode of the first semiconductor element and the positive electrode of the second semiconductor element, and a second terminal connected to the negative electrode of the third semiconductor element and the positive electrode of the fourth semiconductor element, and
a reactor and a second switch electrically connected in series between (i) the negative electrode of the second semiconductor element and the positive electrode of the third semiconductor element, and (ii) the first input electrode, and
the semiconductor testing method further comprises:
charging the first capacitor by turning on the second switch when a DC power supply is electrically connected between the first input electrode and the second input electrode;
turning off the second switch after charging the first capacitor and inputting, to the control electrode of the fourth semiconductor element, the fourth control signal for turning on the fourth semiconductor element; and
inputting, to the control electrode of the first semiconductor element, the first control signal for turning on the first semiconductor element, after the fourth semiconductor element is turned on.

14. The semiconductor testing method according to claim 13, further comprising:
charging the first capacitor and the third capacitor by turning on the second switch and inputting the fourth control signal for turning on the fourth semiconductor element to the control electrode of the fourth semiconductor element;
turning off the second switch after charging the first capacitor and the third capacitor and inputting, to the control electrode of the third semiconductor element, the third control signal for turning on the third semiconductor element; and
inputting, to the control electrode of the second semiconductor element, the second control signal for turning on the second semiconductor element, after the third semiconductor element is turned on.

15. The semiconductor testing method according to claim 10, wherein the second capacitor is not charged when the first switch is in the off state.

16. A manufacturing method for a semiconductor device including a semiconductor element, the manufacturing method comprising:
assembling the semiconductor device by mounting the semiconductor element on a housing;
testing a characteristic of the semiconductor device; and
commercializing the semiconductor device having been acceptable in the testing,
wherein the semiconductor element includes a positive electrode, a negative electrode, and a control electrode, and is turned on or off in response to a control signal input to the control electrode,
the semiconductor device further includes
a first main electrode electrically connected to the positive electrode of the semiconductor element,
a second main electrode electrically connected to the negative electrode of the semiconductor element, and
a first capacitor electrically connected between the first main electrode and the second main electrode,
a series circuit of a second capacitor and a first switch is electrically connected between a positive electrode and a negative electrode of the DC power supply, and
the charging of the first capacitor includes charging the first capacitor while holding the first switch in an off state, and
the testing includes
charging the first capacitor with a DC voltage supplied from a DC power supply electrically connected between the first main electrode and the second main electrode, and
inputting, to the control electrode of the semiconductor element, the control signal for turning on the semiconductor element, after charging the first capacitor.

17. The manufacturing method according to claim 16, wherein the second capacitor is not charged when the first switch is in the off state.

* * * * *